(12) United States Patent
Gering

(10) Patent No.: US 8,467,984 B2
(45) Date of Patent: Jun. 18, 2013

(54) SYSTEMS, METHODS AND COMPUTER READABLE MEDIA FOR ESTIMATING CAPACITY LOSS IN RECHARGEABLE ELECTROCHEMICAL CELLS

(75) Inventor: Kevin L. Gering, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 512 days.

(21) Appl. No.: 12/571,253

(22) Filed: Sep. 30, 2009

(65) Prior Publication Data

US 2011/0077880 A1    Mar. 31, 2011

(51) Int. Cl.
*G01R 31/36* (2006.01)

(52) U.S. Cl.
USPC .......................................................... 702/63

(58) Field of Classification Search
USPC .......................................................... 702/63
See application file for complete search history.

(56) References Cited

U.S. PATENT DOCUMENTS

| | | | |
|---|---|---|---|
| 6,480,003 B1 | 11/2002 | Ugaji et al. | |
| 7,147,071 B2 | 12/2006 | Gering et al. | |
| 7,315,789 B2 | 1/2008 | Plett | |
| 7,400,149 B2 | 7/2008 | Koster et al. | |
| 7,582,387 B2 | 9/2009 | Howard et al. | |
| 8,191,618 B2 | 6/2012 | Gering et al. | |
| 2001/0009371 A1 | 7/2001 | Podrazhansky et al. | |
| 2001/0022518 A1 | 9/2001 | Asakura et al. | |
| 2003/0022032 A1 | 1/2003 | Miller et al. | |
| 2004/0220758 A1 | 11/2004 | Barsoukov et al. | |
| 2006/0181953 A1 | 8/2006 | Rotenberg et al. | |
| 2006/0186890 A1 | 8/2006 | Iwane et al. | |
| 2006/0284617 A1 | 12/2006 | Kozlowski et al. | |
| 2007/0090844 A1 | 4/2007 | Klang | |
| 2007/0112475 A1 | 5/2007 | Koebler et al. | |
| 2007/0252601 A1 | 11/2007 | Satoh et al. | |
| 2008/0154956 A1 | 6/2008 | DeBie | |
| 2009/0106970 A1 | 4/2009 | Fan et al. | |

(Continued)

FOREIGN PATENT DOCUMENTS

WO    2008/154956 A1    12/2008
WO    2009/091407 A2    7/2009

OTHER PUBLICATIONS

Christophersen et al. "Advanced Technology Development Program for Lithium-Ion Batteries: Gen 2 Performance Evaluation Final Report", Jul. 2006, Idaho National Laboratory, 140 pages.*

(Continued)

*Primary Examiner* — Alexander H Taningco
*Assistant Examiner* — Manuel Rivera Vargas
(74) *Attorney, Agent, or Firm* — TraskBritt

(57) ABSTRACT

A system includes an electrochemical cell, monitoring hardware, and a computing system. The monitoring hardware periodically samples charge characteristics of the electrochemical cell. The computing system periodically determines cell information from the charge characteristics of the electrochemical cell. The computing system also periodically adds a first degradation characteristic from the cell information to a first sigmoid expression, periodically adds a second degradation characteristic from the cell information to a second sigmoid expression and combines the first sigmoid expression and the second sigmoid expression to develop or augment a multiple sigmoid model (MSM) of the electrochemical cell. The MSM may be used to estimate a capacity loss of the electrochemical cell at a desired point in time and analyze other characteristics of the electrochemical cell. The first and second degradation characteristics may be loss of active host sites and loss of free lithium for Li-ion cells.

24 Claims, 19 Drawing Sheets

U.S. PATENT DOCUMENTS

| | | |
|---|---|---|
| 2009/0157369 A1 | 6/2009 | Li et al. |
| 2010/0021776 A1 | 1/2010 | Dougherty et al. |
| 2011/0060565 A1 | 3/2011 | Sciarretta et al. |
| 2011/0264381 A1 | 10/2011 | Gering |
| 2011/0288797 A1 | 11/2011 | Schmidt |
| 2011/0301931 A1 | 12/2011 | Gering |

OTHER PUBLICATIONS

Gering et al. "Evaluation of Performance Change in Lithium-ion Cells Using a Multiple Sigmoid Model", 2003, The Electrochemical Society, Inc., 1 page.*

Christophersen et al. ("Advanced Technology Development Program for Lithium-Ion Batteries: Gen 2 Performance Evaluation Final Report", Jul. 2006, Idaho National Laboratory, All pages).*

PCT International Search Report and Written Opinion of the International Searching Authority for PCT/US2011/038078, dated Sep. 9, 2011, 9 pages.

Ding et al., "Diminution of Supercooling of Electrolytes by Carbon Particles," J. Electrochem. Soc., vol. 146 (11), pp. 3974-3980, (1999).

Santana et al., "Electrochemical characterization and oxygen evolution at a heavily boron doped diamond electrode," Electrochem. Acta, vol. 50, pp. 2017-2027 (2005).

Wang et al., "Feasibility study for reductive destruction of carbon tetrachloride using bare and polymer coated nickel electrodes," J. Appl. Electrochemistry, vol. 35, pp. 243-248 (2005).

Christophersen et al., "Advanced Technology Development Program for Lithium-Ion Batteries: Gen 2 Performance Evaluation Final Report," Idaho National Laboratory, Jul. 2006. [retrieved on 2010-20-21] Retrieved from the internet: <URL: http://www.inl.gov/technical/publications/Documents/3395031.pdf>.

PCT International Search Report and Written Opinion of the International Searching Authority for PCT/US2010/048708, dated Nov. 9, 2010, 9 pages.

Gering, Kevin L., "Kinetic Performance of Li-ion cells during Short Pulses, with Emphasis on Low Temperature Behavior," Idaho National Laboratory, 2008, Retrieved from the Internet: <URL: http://web.archive.org/web/20081207132503/http://www.electrochem.org/meetings/scheduler/abstracts/214/1288.pdf> p. 1.

Ratnakumar et al., "Lithium-Ion Rechargeable Batteries on Mars Rover," 2nd International Energy Conversion Engineering Conference, 2004, Retrieved from the Internet: <URL: http://trs-new.jpl.nasa.gov/dspace/handle/2014/38818> pp. 1-8.

PCT International Search Report and Written Opinion of the International Searching Authority for PCT/US2011/030862, dated Jun. 21, 2011, 12 pages.

Domenico et al., "Lithium-Ion battery state of charge estimation with a Kalman Filter based on a electrochemical model," 2008, IEEE, pp. 702-707.

* cited by examiner

SYSTEMS, METHODS AND COMPUTER READABLE MEDIA FOR ESTIMATING CAPACITY LOSS IN RECHARGEABLE ELECTROCHEMICAL CELLS

CONTRACTUAL ORIGIN OF THE INVENTION

This invention was made with government support under Contract Number DE-AC07-05ID14517 awarded by the United States Department of Energy. The government has certain rights in the invention.

TECHNICAL FIELD

The present invention relates generally to the field of batteries. Specifically, embodiments of the present invention relate to analysis of rechargeable batteries.

BACKGROUND

A battery converts stored chemical energy to electrical energy, which may be conveyed as a voltage source. As a battery ages its storage capacity will decrease (i.e., fade) between a Beginning Of Life (BOL) and an End Of Life (EOL). Therefore, observations of battery parameters such as cycle rate, cumulative cycling time, and storage capacity may be helpful in determining an overall State Of Health (SOH) of a battery over its service life.

Battery fuel gauges, battery capacity monitors, and battery status monitors attempt to report battery capacities and give the user an idea of remaining capacity. Conventionally, battery capacity is estimated by current integration, voltage monitoring, or combinations thereof.

Current integration, or coulomb counting as it is commonly called, monitors the battery's available stored charge by measuring the amount of charge that enters and exits the battery through normal cycling. The basis for this approach is that if all charge and discharge currents are known, the amount of coulometric capacity will be known.

Voltage monitoring methods are based on the recognized relationship between the battery terminal voltage and the remaining capacity. All that is required is voltage measurement of the battery terminals to acquire a rough idea of the State Of Charge (SOC) of the battery.

Voltage monitoring may show errors when measurements are taken with load on the battery. When a load is applied, the voltage drop due to the internal impedance of the battery distorts battery voltage. For many batteries, such as lithium-ion batteries, even after the load is removed, slow time constants and relaxation processes may continue to change the battery voltage for hours. Also, some battery chemistries (e.g., nickel metal-hydride) exhibit a strong voltaic hysteresis, which hinders the possibility of using voltage to track capacity.

SOC algorithms and measurement techniques are well known, but methods to predict battery life are less common. There is a need for systems and methods that provide a modeling capability that more accurately determines, tracks, diagnoses, and predicts capacity loss in electrochemical cells and batteries formed therefrom.

BRIEF SUMMARY OF THE INVENTION

Embodiments of the present invention provide a modeling capability that more accurately determines, tracks, diagnoses, and predicts capacity loss in electrochemical cells and batteries formed therefrom.

An embodiment of the present invention comprises a method including analyzing a first degradation characteristic of an electrochemical cell modeled with a first sigmoid expression and analyzing a second degradation characteristic of the electrochemical cell modeled with a second sigmoid expression. The first sigmoid expression and the second sigmoid expression are combined to develop a multiple sigmoid model. The method also includes estimating a capacity loss of the electrochemical cell at a desired point in time using the multiple sigmoid model and modifying at least one of a discharge process for, a charge process for, and a composition of the electrochemical cell responsive to the estimating the capacity loss.

Another embodiment of the present invention comprises an analysis method wherein at least one act of the method is performed by a processor. The method includes analyzing a first degradation characteristic of an electrochemical cell modeled with a first sigmoid expression and analyzing a second degradation characteristic of the electrochemical cell modeled with a second sigmoid expression. The first sigmoid expression and the second sigmoid expression are combined to develop a multiple sigmoid model. The method also includes estimating a capacity loss of the electrochemical cell at a desired point in time using the multiple sigmoid model.

Another embodiment of the present invention also comprises a model development method wherein at least one act of the method is performed by a processor. The method includes periodically sampling cell characteristics of an electrochemical cell. A first degradation characteristic and a second degradation characteristic are determined from the cell characteristics. The method also includes periodically adding the first degradation characteristic to a first sigmoid expression, periodically adding the second degradation characteristic to a second sigmoid expression, and combining the first sigmoid expression and the second sigmoid expression to develop or augment a multiple sigmoid model of the electrochemical cell.

Another embodiment of the present invention comprises a system including at least one electrochemical cell, monitoring hardware, and a computing system. The monitoring hardware is operably coupled to the at least one electrochemical cell and is configured for periodically sampling cell characteristics of the at least one electrochemical cell. The computing system is operably coupled to the monitoring hardware and is configured for periodically determining electrochemical cell information from the cell characteristics of the electrochemical cell. The computing system is also configured for periodically adding a first degradation characteristic from the electrochemical cell information to a first sigmoid expression, periodically adding a second degradation characteristic from the electrochemical cell information to a second sigmoid expression and combining the first sigmoid expression and the second sigmoid expression to develop or augment a multiple sigmoid model of the at least one electrochemical cell.

Another embodiment of the present invention comprises a computer-readable medium including computer-executable instructions, which when executed on one or more processors, cause the processors to periodically sample cell characteristics of an electrochemical cell and determine a first degradation characteristic and a second degradation characteristic from the cell characteristics. The computer-executable instructions also cause the one or more processors to periodically add the first degradation characteristic to a first sigmoid expression, periodically add the second degradation characteristic to a second sigmoid expression, and combine the first sigmoid expression and the second sigmoid expression to develop or augment a multiple sigmoid model of the electrochemical cell.

BRIEF DESCRIPTION OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings, in which:

DETAILED DESCRIPTION OF THE INVENTION

Figure 1:
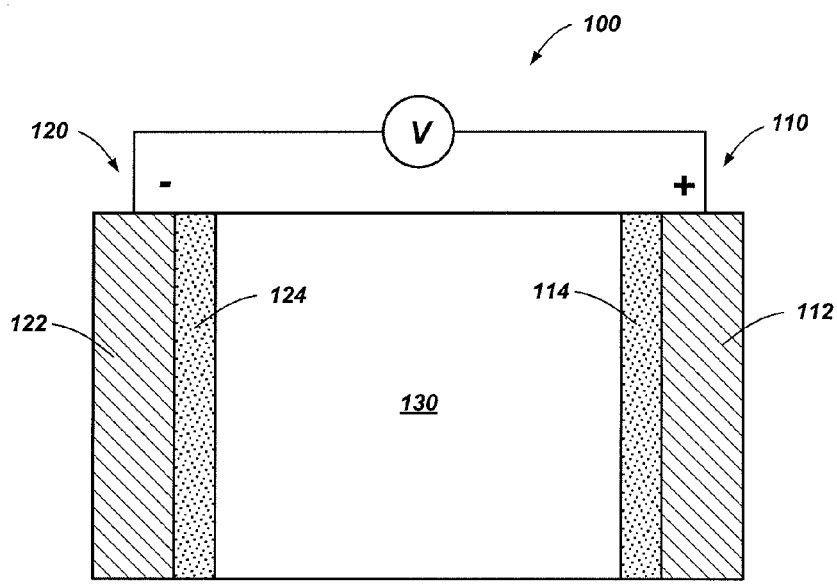
FIG. 1 is a simplified diagram of a rechargeable electrochemical cell.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings that form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of skill would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Headings are included herein to aid in locating certain sections of detailed description. These headings should not be considered to limit the scope of the concepts described under any specific heading. Furthermore, concepts described in any specific heading are generally applicable in other sections throughout the entire specification.

Embodiments of the present invention provide a modeling capability that more accurately determines, tracks, diagnoses, and predicts capacity loss in electrochemical cells and batteries formed therefrom.

1. Hardware Environment

Much of the description herein concentrates on lithium-ion cells. However, embodiments of the present invention are not so limited and may be applicable to other types of electrochemical cells and other systems that degrade over time due to two or more mechanisms that may be accurately modeled.

FIG. 1 is a simplified diagram of a rechargeable lithium-ion electrochemical cell 100. A typical lithium-ion cell 100 includes three primary functional components, an anode 110, a cathode 120, and electrolyte 130. The electrochemical cell 100 may also include a separator (e.g., a polymeric microporous material, not shown) provided between the cathode 120 and the anode 110. A battery may include one or more electrochemical cells 100 to form a current and voltage capability based on the application for which it is used.

The anode 110 includes a positive current collector 112 and a positive active material 114. The cathode 120 includes a negative current collector 122 and a negative active material 124. Both the positive active material 114 and the negative active material 124 are materials into which and from which lithium ions can migrate. The movement of lithium ions into the active materials (114, 124) is often referred to as intercalation or insertion and the movement of lithium ions out of the active materials (114, 124) is referred to as deintercalation or extraction.

The negative active material 124 may be a carbonaceous material such as graphite. The positive active material 114 may be a material, such as, for example, lithium cobalt oxide, lithium iron phosphate, or lithium manganese oxide. The positive current collector 112 and negative current collector 122 may be a material such as aluminum, copper, or other suitable electrically conductive material. The electrolyte 130 is typically an organic electrolyte that acts as an ionic path between electrodes 110 and 120.

The electrodes (110, 120) may be provided as relatively flat or planar plates or may be wrapped or wound in a spiral or other configuration (e.g., an oval configuration). The electrodes (110, 120) may also be provided in a folded configuration.

During charging and discharging of the electrochemical cell 100, lithium ions move through the electrolyte 130 between the positive electrode 110 and the negative electrode 120. For example, when the electrochemical cell 100 is discharging, lithium ions flow from the negative electrode 120 to the positive electrode 110. Conversely, when the electrochemical cell 100 is charging, lithium ions flow from the positive electrode 110 to the negative electrode 120.

A passivating layer, also referred to herein as solid electrolyte interphase (SET), may develop between an electrode (110, 120) and the electrolyte 130 from the reductive decompositions of a small amount of organic electrolytes mostly during the first several cycles of a working cell.

Figure 2:
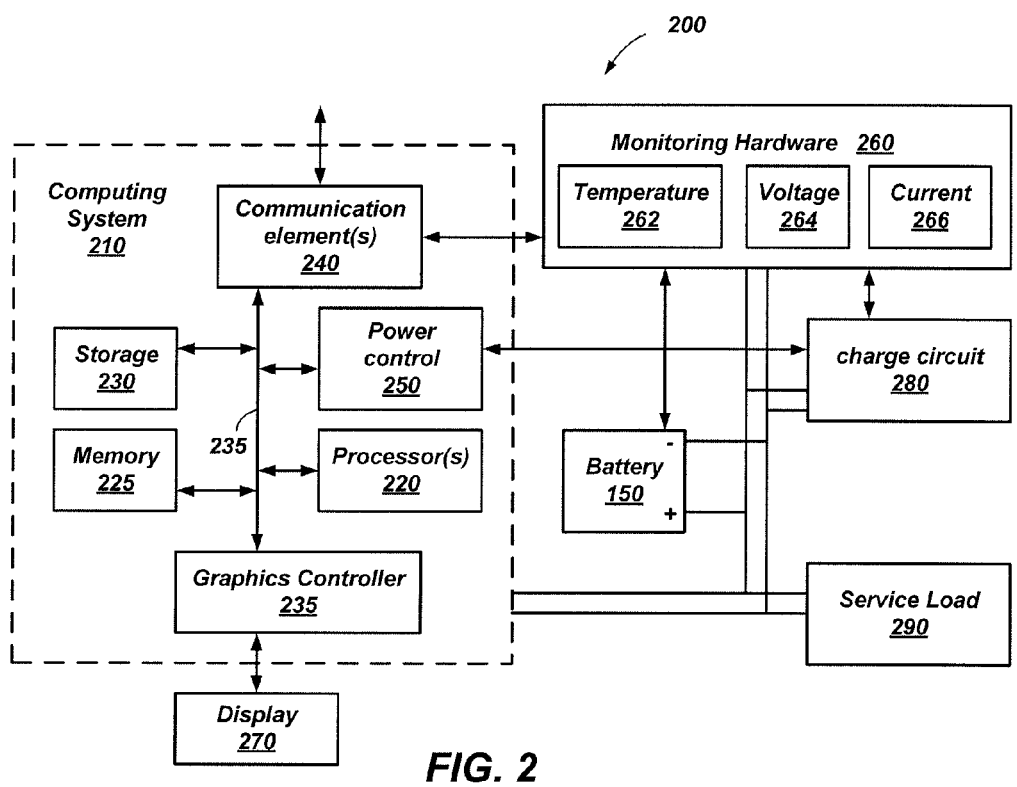
FIG. 2 is a simplified diagram of a system for analyzing, controlling, or a combination thereof, an electrochemical cell.

FIG. 2 is a simplified diagram of a system 200 for analyzing, monitoring, and controlling a battery 150. A computing system 210 is configured for executing software programs containing computing instructions and includes one or more processors 220, memory 225, one or more communication elements 240, and storage 230.

The one or more processors 220 may be configured for executing a wide variety of operating systems and applications including the computing instructions for carrying out embodiments of the present invention.

The memory 225 may be used to hold computing instructions, data, and other information for performing a wide variety of tasks including performing embodiments of the present invention. By way of example, and not limitation, the memory may include Synchronous Random Access Memory (SRAM), Dynamic RAM (DRAM), Read-Only Memory (ROM), Flash memory, and the like.

The communication elements 240 may be configured for communicating with other devices or communication networks (not shown). As non-limiting examples, the communication elements 240 may interface with external hardware and software (e.g., for cell or battery charging through an external device or grid) or for downloading stored data to an external data logger, or computer. By way of example, and not limitation, the communication elements 240 may include elements for communicating on wired and wireless communication media, such as for example, serial ports, parallel ports, Ethernet connections, universal serial bus (USB) connections IEEE 1394 ("firewire") connections, bluetooth wireless connections, 802.1a/b/g/n type wireless connections, and other suitable communication interfaces and protocols.

The storage 230 may be used for storing large amounts of non-volatile information for use in the computing system 210 and may be configured as one or more storage devices. By way of example, and not limitation, these storage devices may be but are not limited to magnetic and optical storage devices such as disk/disc drives, magnetic tapes, CDs (compact discs), DVDs (digital versatile discs or digital video discs), and other equivalent storage devices.

When executed as firmware or software, the instructions for performing the processes described herein may be stored on a computer-readable medium. A computer-readable medium includes, but is not limited to, magnetic and optical storage devices such as disk/disc drives, magnetic tape, CDs (compact discs), DVDs (digital versatile discs or digital video discs), and semiconductor devices such as RAM, DRAM, ROM, EPROM, and Flash memory.

By way of non-limiting example, computing instructions for performing the processes may be held on the storage 230, transferred to the memory 225 for execution, and executed by the processor 220. The processor 220, when executing computing instructions configured for performing the processes, constitutes structure for performing the processes. In addition, some or all portions of the processes may be performed by hardware specifically configured for carrying out the processes.

The storage 230 and memory 225 are coupled to the processor 220 such that the processor 220 can read information from, and write information thereto. In the alternative, the storage medium may be integral to the processor. Furthermore, the processor 230, memory 225 and storage 230 may reside, in various combinations, in an ASIC or FPGA.

A graphics controller 235 is coupled to the processor 220 and to a display 270, which may present information about the battery 150 and the processes described herein in the form of pictures, text, tables, graphs, and the like.

The elements of the computing system 210 are illustrated, for simplicity, as communicating across a bus 235. However, those of ordinary skill in the art will recognize that the computing system may include many different busses for communication between the various elements.

Monitoring hardware 260 may be included in the system 200 for monitoring various cell characteristics, functions, and status of the battery 150. As is known in the art, a voltage monitor 264 and a current monitor 266 may be coupled to the battery 150 to monitor operational power characteristics of the battery. A temperature monitor 262 may be included to monitor overall temperature of the battery, temperature of individual cells in the battery, and combinations thereof. A timing monitor (not shown) may be included as monitoring hardware 260 or may be performed by the computing system 210. The timing monitor may track cycling of the battery 150 including times associated with charging and discharging the battery 150. The monitoring hardware 260 may be controlled and queried by the computing system 210 through general purpose or dedicated communication channels from the communication elements 240.

A charge circuit 280 may be included to control charging and possibly discharging of the battery 150. The charge circuit 280 may provide information related to timing and electrical power characteristics of the battery 150 to the monitoring hardware 260. The charge circuit may be controlled by a dedicated power control module 250 on the computing system 210. Alternatively, the computing system 210 may control the charge circuit 280 through general purpose or dedicated communication channels from the communication elements 240.

A service load 290 generally represents other elements (not shown) within the system 200 that may draw power from the battery 150.

Functionally, the processes described herein may be considered to be controlled by a diagnostic center software process. The software process may include test protocols defined for cell interrogation using elements for data acquisition of cell characteristics such as current, voltage, and temperature over time and charge cycling. Diagnostic analysis algorithms may be defined as discussed below. Data regression algorithms may be implemented to define and refine various models and model parameters. Software modules may be included to store data in various raw and processed forms as may be needed by other processes and a data logger may be included to collect and store a performance history of the battery 150.

Thus, the system 200 may be configured to periodically sample cell characteristics of an electrochemical cell (e.g., a battery 150) and determine electrochemical cell information from the sampled characteristics. From the electrochemical cell information degradation characteristics of the battery 150 may be determined and incorporated into one or more sigmoid expressions, which may be combined to form a multiple-sigmoid model. As will be explained below, some of the degradation characteristics may include loss of active host sites, loss of free lithium sites, reversible losses, and irreversible losses.

2. Multiple-Sigmoid Models

In developing sophisticated models that are aimed at capturing transient real phenomena in complex systems, it is necessary to evaluate the modeling capability against a set of relevant requirements for the intended application. As a general summary, some requirements to consider for so-called mechanistic models may be discussed as covering mathematical considerations, relationships derived from Chemical Kinetic Rate Expressions (CKRE), and other general considerations.

Mathematical consideration may include whether there are proper boundary condition at time zero (t0) and at large time (t∞), as well as time differentiated versions thereof. Other mathematical considerations may include whether a model accurately correlates with data for the full range of conditions (i.e., robustness) and whether the model possesses adequate sophistication to capture subtle behavior in the data (i.e., rigor). Other mathematical considerations may include whether a time-differentiated analytical form faithfully correlates with empirical rate data and whether model variables can be parameterized to reflect their dependency on predominant test conditions.

CKRE consideration may include whether the model is translatable or linkable with a CKRE that is appropriate for the net or overall mechanism that affects a particular cell component (e.g., anode, cathode, separator, etc.). Other CKRE consideration may include whether the CKRE is properly bounded, whether the CKRE is based on meaningful physical and chemical quantities, and whether the CKRE covers the full range of conditions of interest. Still other CKRE consideration may include whether the CKRE incorporates correct reaction stoichiometry, limiting conditions, and combinations thereof defined by material proportions (e.g., conservation of mass).

Other general consideration may include whether the model format allow for a reasonable segregation of the predominant degradation mechanisms (e.g., cathode vs. anode, ohmic vs. polarization components, etc.). Still other general consideration may include whether the model can be used for predicting behavior past the extent of data (i.e., extrapolation) and between test conditions (i.e., interpolation). Still other general consideration may include whether the model can capture pertinent thermodynamic considerations (e.g., conservation of mass, energy, and momentum; entropic effects, etc.) and geometric influences (e.g., particle sizes, electrode thickness, etc.). Still other general consideration may include whether the model can be applied more broadly to other electrochemical cells or other systems that may degrade and whether the model can be easily validated with representative diagnostic data.

The Multiple-Sigmoid Models (MSM) according to embodiments of the present invention and described herein may address all of these considerations to some extent.

2.1. Capacity Loss

Available capacity figures centrally into performance characterization of Li-ion cells over their service life. There are tandem needs to accurately interpret capacity of electrochemical cells (may be referred to herein simply as "cells") at characterization conditions (cycling rate, temperature, etc.) and for robust self-consistent modeling techniques that can be used for diagnostic analysis of electrochemical cell data as well as forecasting of future performance. To address these needs, embodiments of the present invention include a modeling capability to provide a systematic analysis of the contributing factors to capacity loss and to act as a regression and prediction platform for electrochemical cell performance. The modeling supports diagnostic analysis of electrochemical cells, with a focus on lithium-ion cells, providing a basis for determining the predominant mechanisms that affect available capacity in such devices. Hence, the modeling will facilitate lithium-ion technology improvement by isolating failure sources. Also, the model accommodates prediction or forecasting of capacity loss, allowing evaluation of remaining useful life as based on a minimum performance criteria.

The modeling basis is a summation of self-consistent chemical kinetics rate expressions, which as individual expressions each covers a distinct degradation mechanism, but collectively account for the net capacity loss over time for a particular characterization condition. Irreversible and reversible capacity losses also may be predicted by the model.

Figure 3A:
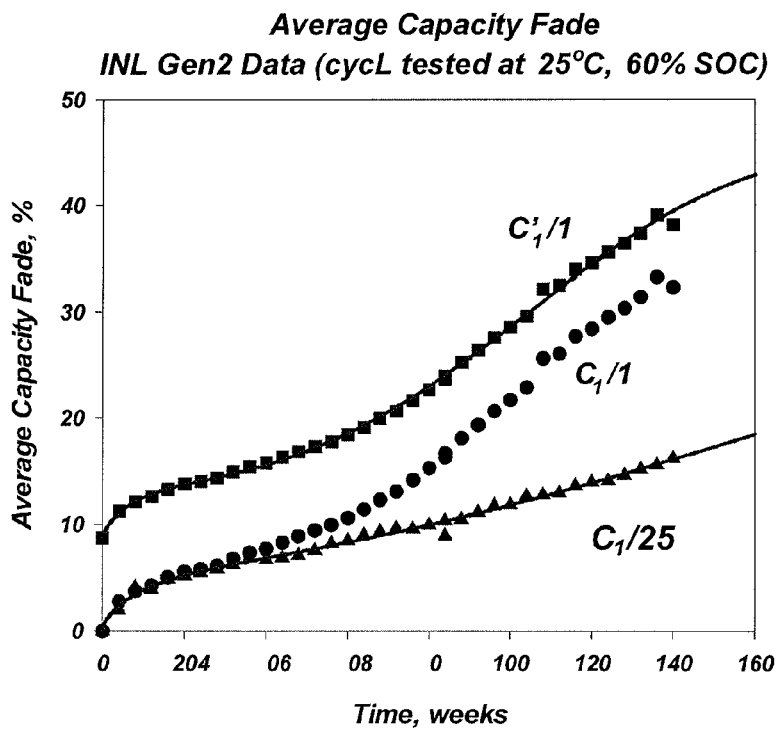
FIGS. 3A-3C illustrate discharge capacity fade data for various electrochemical cells tested under cycle-life (cycL) conditions.
Figure 3B:
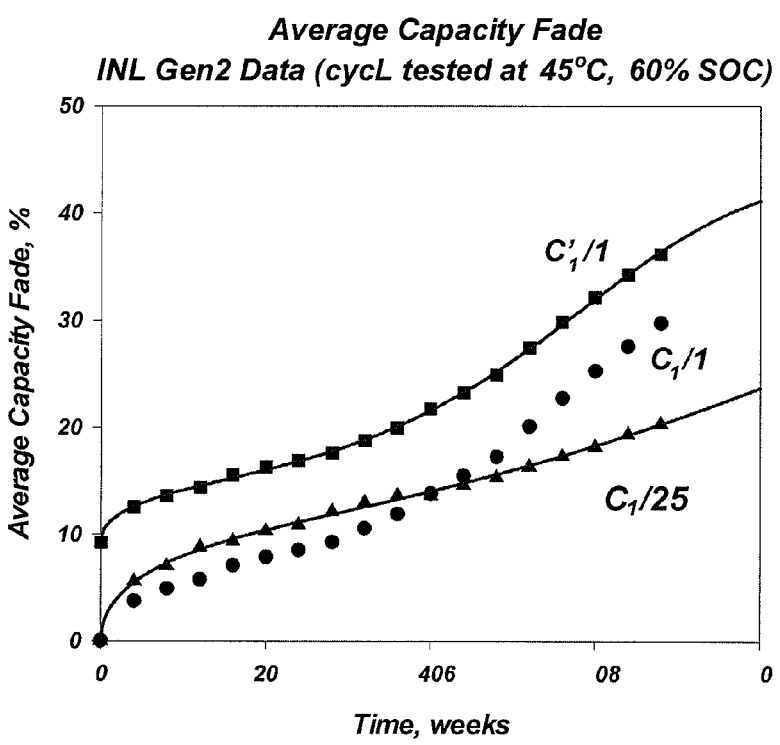
Figure 3C:
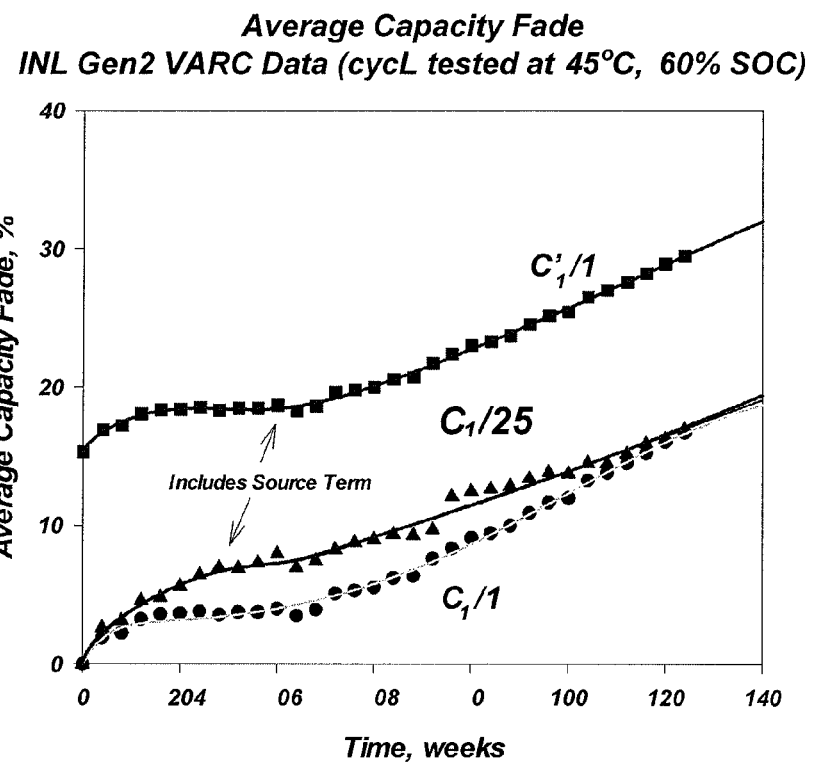

FIGS. 3A-3C illustrate discharge capacity fade data for various electrochemical cells tested under cycle-life (cycL) conditions.

For the most part, the graphs displayed herein include data from two types of batteries under various conditions as labeled above the graphs. The data was gathered at the Idaho National Labs (INL) and some of the data may be gathered under the Department of Energy Advanced Technology Development (ATD) program.

"Gen2" Li-ion cells of the spiral-wound 18650 configuration were tested at the INL under various conditions, including cycle-life testing. As one example, baseline cells included a LiNi0.8Co0.15Al0.05O2 cathode (35 μM laminate), a MAG10 carbon anode (also 35 μm laminate), an electrolyte of a 3:7 mass ratio of ethylene carbonate (EC) to ethyl methyl carbonate (EMC) with 1.2M LiPF6, and a 2300 series Celgard separator. A variation in the Gen2 chemistry, variation C (VARC) was also tested in tandem with the baseline Gen2 chemistry.

The cells were tested under a cycle-life (cycL) protocol, which was based on a scaled power goal (i.e., a 25-Wh Power Assist Profile used for hybrid vehicles), wherein cells underwent short constant power discharge and charge pulses (about 10 seconds each) separated by rest periods, all centered at 60% SOC. This testing was performed continuously at either 25° C. or 45° C., using a test month of 28 days, with reference performance testing (RPT) after each 28-day period. Several test months were covered in some cases. Testing was generally suspended when a cell reached 50% power fade.

Generally, a cell has a rated capacity, such as, for example 2 amp-hours. The data presented herein is presented at different relative discharge rates relative to rated capacity. An arbitrary baseline rate, defined as C/25, indicates that the capacity of the cell will be exhausted over a 25-hour period. The other rate C/1 indicates that the capacity of the cell will be exhausted over a one-hour period.

Thus, FIG. 3A illustrates average capacity fade over time for Gen2 cells cycle-life tested at 25° C. and centered at 60% SOC. FIG. 3B illustrates average capacity fade over time for Gen2 cells cycle-life tested at 45° C. and centered at 60% SOC. Finally, FIG. 3C illustrates average capacity fade over time for Gen2 VARC cells cycle-life tested at 45° C. and centered at 60% SOC.

All FIGS. 3A-3C illustrate testing at cycle rates of C/1 (designated $C_1/1$ with data points shown as dots) and C/25 (designated as $C_1/25$ with data points shown as triangles). The $C'_1/1$ data points shown as squares include a polarization offset that occurs due to the difference between the $C_1/1$ and $C_1/25$ cycling rates. The solid lines generally following the $C'_1/1$ and $C_1/25$ data points indicate substantially accurate model predictions of capacity fade as discussed below.

In defining the model, we start by defining two terms related to cell capacity:

$f_\theta$ Fraction of Active, Available Sites (FAAS) remaining at time t for Li$^+$ charge transfer and intercalation; specific to charge or discharge conditions; and $f_{Li^+}$ Fraction of Available Labile Li$^+$ (FALL) remaining at time t which is a fraction of Li$^+$ within the bulk electrolyte, SEI, and solid particles (both cathode and anode) that is available for transport between electrodes.

Capacity loss in Li-ion cells is due to a combination of mechanisms, including loss of free available lithium, loss of active host sites, shifts in the potential-capacity curve, etc. In general a Li-ion cell needs both healthy FAAS and FALL to function well. FAAS and FALL can both change over time, decreasing due to various degradation mechanisms. The degradation of FAAS may be referred to herein as loss of active host sites and the degradation of FALL may be referred to herein as loss of free lithium.

Examples of degradation mechanisms for FAAS include:
Permanent blockage of intercalation pathways at the particle surface, including conductively-dead SEI;
"Poisoning" of intercalation sites by contaminants or by products from irreversible chemical reactions;
Mechanical degradation of solid state; and
Temporary (reversible) blockage of intercalation pathways via phase transition at the particle interface.

Examples of degradation mechanisms for FALL include:
Irreversible consumption of Li$^+$ in the SEI;
Irreversible consumption of Li$^+$ in other side reactions, including formation of Li°;
Reversible consumption of Li$^+$ in temporary phase transitions as f(T), (e.g., solid solvates); and
Li$^+$ trapped/sequestered in the solid state.

FAAS and FALL use the follow definitions and notations:

$$\left[\begin{array}{l} FAAS = f_\theta \equiv \dfrac{C_\theta(t, r, T, SOC)}{C_\theta^0(r, T, SOC)} \\ FALL = f_{Li^+} \equiv \dfrac{C_{Li^+}(t, r, T, SOC)}{C_{Li^+}^0(r, T, SOC)} \end{array}\right]_i \quad (1a, b)$$

wherein:
C=concentration scale;
i=aging test condition;
r=cycling rate used to assess capacity;
SOC=target state of charge at i;
T=temperature; and Fractional loss in FAAS over time=$\Psi_\theta = 1 - f_\theta$ Fractional loss in FALL over time=$\Psi_{Li^+} = 1 - f_{Li^+}$ \quad (2a,b)

In equations 1a and 1b, superscript zero denotes a time-zero condition, and it is implied that all f and $\Psi$ terms are functions of time except those denoted at zero time. Also:

$$\Psi_\theta = \Psi_\theta \overline{f}_\theta \text{ where } \begin{array}{l} \overline{f}_\theta \to 0 \text{ as } C_\theta \gg C_{Li^+} \\ \to 1 \text{ as } C_\theta \ll C_{Li^+} \end{array} \quad (3a)$$

$$\Psi_{Li^+} = \Psi_{Li^+} \overline{f}_{Li^+} \text{ where } \begin{array}{l} \overline{f}_{Li^+} \to 0 \text{ as } C_\theta \ll C_{Li^+} \\ \to 1 \text{ as } C_\theta \gg C_{Li^+} \end{array} \quad (3b)$$

In other words, equations 3a and 3b indicate that the limiting concentration will dominate $\Psi$ behavior.

Forms for $\bar{f}_\theta$, $\bar{f}_{Li^+}$ are defined here as:

$$\bar{f}_\theta \frac{C_{Li^+}}{C_\theta + C_{Li^+}}; \quad \bar{f}_{Li^+} = \frac{C_\theta}{C_\theta + C_{Li^+}} \quad (4a, b)$$

These forms shown in equations 4a and 4b, yield correct trends and are bounded between 0 and 1. At $C_\theta=C_{Li+}$, $\bar{f}_\theta$, $\bar{f}_{Li^+}+\frac{1}{2}$, saying that at this condition, both the active host sites and the available lithium play an equal part in determining $\Psi$.

Thus, we have:

$$\Psi_\theta = \Psi_\theta \cdot \bar{f}_\theta \quad (5a, b)$$

$$= \Psi_\theta \left(\frac{C_{Li^+}}{C_\theta + C_{Li^+}}\right)$$

$$= \left(1 - \frac{C_\theta}{C_\theta^0}\right)\left(\frac{C_{Li^+}}{C_\theta + C_{Li^+}}\right)$$

$$\Psi_{Li^+} = \Psi_{Li^+} \cdot \bar{f}_{Li^+}$$

$$= \Psi_{Li^+}\left(\frac{C_\theta}{C_\theta + C_{Li^+}}\right)$$

$$= \left(1 - \frac{C_{Li^+}}{C_{Li^+}^0}\right)\left(\frac{C_\theta}{C_\theta + C_{Li^+}}\right)$$

And the net loss at aging test condition is:

$$\Psi_i = \Psi_\theta + \Psi_{Li^+} \quad (6)$$

$$= \left(\frac{C_\theta^0 - C_\theta}{C_\theta^0}\right)\left(\frac{C_{Li^+}}{C_\theta + C_{Li^+}}\right) + \left(\frac{C_{Li^+}^0 - C_{Li^+}}{C_{Li^+}^0}\right)\left(\frac{C_\theta}{C_\theta + C_{Li^+}}\right)$$

These results of equation 6 are dependent on (time, capacity cycling rate, Ti, SOCi), and whether charge or discharge is the capacity basis. We may also include a capacity source term (negative loss) if the electrode materials possess a "lithium reserve" that becomes available over time, as represented by equation 7:

$$\Psi_i = \Psi_\theta + \Psi_{Li^+} + \Psi_{source} = \Psi_\theta + \Psi_{Li^+} + \Psi_{\theta,source} + \Psi_{Li^+,source} = \Psi_{\theta,net} + \Psi_{Li^+,net} \quad (7)$$

Most of the discussion herein will focus on capacity loss terms, where we can then derive relevant concentration terms from the previous development:

$$\therefore C_\theta = \frac{C_{Li^+}^0 C_\theta^0 (1 - \Psi_i)}{C_\theta^0 \Psi_\theta + C_{Li^+}^0 (1 - \Psi_{Li^+})} \quad (8a, b, c)$$

and then $$C_{Li^+} = \frac{\alpha C_\theta}{(1-\alpha)}, \text{ where } \alpha \equiv \frac{C_\theta^0 \Psi_\theta}{C_\theta^0 - C_\theta}$$

2.2. Sigmoid Expressions

Figure 4:
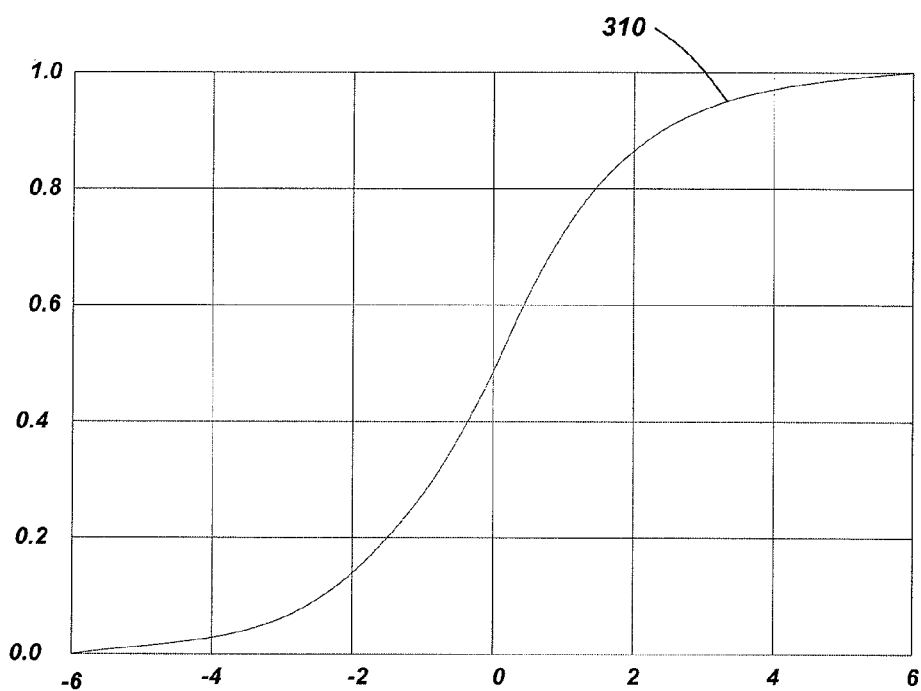
FIG. 4 illustrates a general response from a sigmoid expression.

FIG. 4 illustrates a general response to a sigmoid expression 310. Many natural processes and complex systems, such as the degradations described herein, may display a history dependent progression that begins small, accelerates, then plateaus over time. A sigmoid expression may be used to model such behavior. In embodiments of the present invention, sigmoid-based rate expressions are utilized to describe each contribution to capacity loss in cells.

Sigmoid-based rate expressions may be represented as the chemical kinetics (CK) rate expressions for the various capacity fade contributions since they can incorporate salient physical parameters, chemical parameters, and a combination thereof.

Sigmoid expressions are useful in looking at complex phenomena over various domains, as they are robust, contain only three parameters, are easily differentiable, and highly accurate once reasonable estimates have been given for the parameters. They can also be combined (e.g., summed) to evaluate multiple mechanistic contributions to a phenomenon, denoted herein as a multiple sigmoid model (MSM). The sigmoidal plateau that develops at large time represents a thermodynamic equilibrium boundary for maximal extent of reaction within a batch reactor for the given set of test conditions, considering only those mechanisms included in the model. If additional capacity loss mechanisms become manifest much later in cell life, or if mechanisms become interdependent or second-order, then the plateau will increase accordingly but never past the theoretical maximum of 100 percent capacity loss. Collectively, these features insure that the resultant modeling capability has a relevant theoretical framework supported by a consistent mathematical basis (e.g., properly bounded).

Per the MSM model described herein, for an arbitrary condition i defined at particular test conditions (comprised of temperature, cell SOC or SOC range, aging protocol, and whether charge or discharge capacity is considered), the overall fractional loss in capacity over time (in weeks) is:

$$\Psi_i = \sum_j 2M_j \left[\frac{1}{2} - \frac{1}{1 + \exp(a_j t^{b_j})}\right]_i \quad (9)$$

for $j$ contributing mechanisms

Active host sites and available lithium may be defined as sigmoid expression that may be used as two contribution mechanisms in the multiple sigmoid model. Thus, capacity loss terms may be defined for FAAS and FALL as:

$$\Psi_\theta = 2M_\theta \left[\frac{1}{2} - \frac{1}{1 + \exp(a_\theta t^{b_\theta})}\right]_i \quad (10a)$$

$$\Psi_{Li^+} = 2M_{Li^+} \left[\frac{1}{2} - \frac{1}{1 + \exp(a_{Li^+} t^{b_{Li^+}})}\right]_i \quad (10b)$$

And thus:

$$\Psi_\theta = \left(1 - \frac{C_\theta}{C_\theta^0}\right)\left(\frac{C_{Li^+}}{C_\theta + C_{Li^+}}\right) \quad (10c, d)$$

$$\doteq 2M_\theta \left[\frac{1}{2} - \frac{1}{1 + \exp(a_\theta t^{b_\theta})}\right]_i$$

$$\Psi_{Li^+} = \left(1 - \frac{C_{Li^+}}{C_{Li^+}^0}\right)\left(\frac{C_\theta}{C_\theta + C_{Li^+}}\right)$$

$$\doteq 2M_{Li^+} \left[\frac{1}{2} - \frac{1}{1 + \exp(a_{Li^+} t^{b_{Li^+}})}\right]_i$$

In addition, some models may include a MSM capacity source term for materials that exhibit a lithium reserve, such as is defined in equation 7.

The MSM parameters have a theoretical or physical basis within the time domain. As applied to Li-ion cells under test condition i:

a$_j$ represents the rate constant for the chemical kinetics attributable to mechanism j;

b$_j$ is related to the effective order of reaction for mechanism j; and

M$_j$ is the theoretical maximum limit of capacity loss under mechanism j considering the finite (i.e., thermodynamic limit) of degradation under mechanism j for a batch system.

As previously mentioned $\Psi_i$ represents the fractional decrease of battery performance (e.g., capacity for the current case) for collective test conditions denoted as 'i'. To develop rate expressions involving $\Psi_i$ and its component members $\Psi_\theta$ and $\Psi_{Li^+}$, recall that for the MSM model including active host sites and available lithium: $\Psi_i = \Psi_\theta + \Psi_{Li^+}$.

Then a rate of change for the decrease in capacity in terms of active host sites and available lithium may be described as:

$$\left[ r_i = \frac{d\Psi_i}{dt} = \frac{d\Psi_\theta}{dt} + \frac{d\Psi_{Li^+}}{dt} = r_\theta + r_{Li^+} \right] \quad (11)$$

Thus, in general, the overall rate of change in capacity loss in MSM terms may be defined as:

$$r_i^{MSM} = \frac{d}{dt}(MSM)_i = \sum_j \left[ \frac{2M_j a_j b_j t^{b_j-1} \exp(a_j t^{b_j})}{(1 + \exp(a_j t^{b_j}))^2} \right]_i \quad (12)$$

Recall the definition:

$$\Psi_i = \Psi_\theta + \Psi_{Li^+} \quad (13)$$

$$= \left[ \left( \frac{C_\theta^0 - C_\theta}{C_\theta^0} \right)\left( \frac{C_{Li^+}}{C_\theta + C_{Li^+}} \right) + \left( \frac{C_{Li^+}^0 - C_{Li^+}}{C_{Li^+}^0} \right)\left( \frac{C_\theta}{C_\theta + C_{Li^+}} \right) \right]_i$$

and:

$$\frac{d\Psi_i}{dt} = \frac{d}{dt}\Psi_\theta + \frac{d}{dt}\Psi_{Li^+} \quad (14)$$

$$= \frac{d}{dt}[\Psi_\theta + \Psi_{Li^+}]$$

Looking at the separate terms, first for active host sites:

$$\frac{d}{dt}\Psi_\theta = \frac{d}{dt}\left[ \left( \frac{C_\theta^0 - C_\theta}{C_\theta^0} \right)\left( \frac{C_{Li^+}}{C_\theta + C_{Li^+}} \right) \right] \quad (15)$$

$$\stackrel{!}{=} \{\text{analytical value from } MSM\}$$

$$= \frac{1}{C_\theta^0} \frac{d}{dt}\left[ \frac{C_\theta^0 C_{Li^+} - C_\theta C_{Li^+}}{C_\theta + C_{Li^+}} \right]$$

Using a ratio rule for derivatives:

$$\frac{d}{dt}\left( \frac{u}{v} \right) = \frac{v\frac{du}{dt} - u\frac{dv}{dt}}{v^2} \quad (16)$$

which gives:

$$\frac{d}{dt}\Psi_\theta = \frac{1}{C_\theta^0}\left[ \frac{(C_\theta + C_{Li^+})\frac{d}{dt}(C_\theta^0 C_{Li^+} - C_\theta C_{Li^+}) - (C_\theta^0 C_{Li^+} - C_\theta C_{Li^+})\frac{d}{dt}(C_\theta + C_{Li^+})}{(C_\theta + C_{Li^+})^2} \right] \quad (17)$$

$$= \frac{1}{C_\theta^0(C_\theta + C_{Li^+})^2}\underbrace{\phantom{X}}_{'C'}\left[ \underbrace{\frac{'A'}{(C_\theta + C_{Li^+})}\left[ C_\theta^0 \frac{d}{dt}C_{Li^+} - \left( C_\theta \frac{d}{dt}C_{Li^+} + C_{Li^+}\frac{d}{dt}C_\theta \right) \right]}_{} - \underbrace{(C_\theta^0 C_{Li^+} - C_\theta C_{Li^+})}_{'B'}\left( \frac{d}{dt}C_\theta + \frac{d}{dt}C_{Li^+} \right) \right]$$

$$= \frac{1}{\mathbb{C}}\left[ AC_\theta^0 \frac{dC_{Li^+}}{dt} - AC_\theta \frac{dC_{Li^+}}{dt} - AC_{Li^+}\frac{dC_\theta}{dt} - B\frac{dC_\theta}{dt} - B\frac{dC_{Li^+}}{dt} \right]$$

$$= \frac{1}{\mathbb{C}}\left[ \frac{dC_\theta}{dt}\underbrace{(-AC_{Li^+} - B)}_{\alpha_\theta} + \frac{dC_{Li^+}}{dt}\underbrace{(AC_\theta^0 - AC_\theta - B)}_{\beta_\theta} \right]$$

$$\therefore \left[ \frac{d\Psi_\theta}{dt} = \frac{1}{\mathbb{C}}\left( \alpha_\theta \frac{dC_\theta}{dt} + \beta_\theta \frac{dC_{Li^+}}{dt} \right) \right]$$

Now, looking at available lithium:

$$\frac{d}{dt}\Psi_{Li^+} = \frac{d}{dt}\left[ \left( \frac{C_{Li^+}^0 - C_{Li^+}}{C_{Li^+}^0} \right)\left( \frac{C_\theta}{C_\theta + C_{Li^+}} \right) \right] \quad (18)$$

$$\stackrel{!}{=} \{\text{analytical value from } MSM\}$$

$$= \frac{1}{C_{Li^+}^0} \frac{d}{dt}\left[ \frac{C_{Li^+}^0 C_\theta - C_{Li^+} C_\theta}{C_\theta + C_{Li^+}} \right]$$

Applying the ratio rule for derivatives:

$$\frac{d}{dt}\Psi_{Li^+} = \frac{1}{C_{Li^+}^0}\left[\frac{(C_\theta + C_{Li^+})\frac{d}{dt}(C_{Li^+}^0 C_\theta - C_{Li^+} C_\theta) - (C_{Li^+}^0 C_\theta - C_{Li^+} C_\theta)\frac{d}{dt}(C_\theta + C_{Li^+})}{(C_\theta + C_{Li^+})^2}\right] \quad (19)$$

$$= \frac{1}{\underbrace{C_{Li^+}^0(C_\theta + C_{Li^+})^2}_{'F'}}\left[\underbrace{\overbrace{(C_\theta + C_{Li^+})}^{'D'}}\left[C_{Li^+}^0 \frac{dC_\theta}{dt} - C_{Li^+}\frac{dC_\theta}{dt} - C_\theta\frac{dC_{Li^+}}{dt}\right] - \underbrace{(C_{Li^+}^0 C_\theta - C_{Li^+} C_\theta)}_{'E'}\left(\frac{dC_\theta}{dt} + \frac{dC_{Li^+}}{dt}\right)\right]$$

$$= \frac{1}{F}\left[DC_{Li^+}^0\frac{dC_\theta}{dt} - DC_{Li^+}\frac{dC_\theta}{dt} - DC_\theta\frac{dC_{Li^+}}{dt} - E\frac{dC_\theta}{dt} - E\frac{dC_{Li^+}}{dt}\right]$$

$$= \frac{1}{F}\left[\frac{dC_\theta}{dt}\underbrace{(DC_{Li^+}^0 - DC_{Li^+} - E)}_{\alpha_{Li^+}} + \frac{dC_{Li^+}}{dt}\underbrace{(-DC_\theta - E)}_{\beta_{Li^+}}\right]$$

$$\therefore \left[\frac{d\Psi_{Li^+}}{dt} = \frac{1}{F}\left(\alpha_{Li^+}\frac{dC_\theta}{dt} + \beta_{Li^+}\frac{dC_{Li^+}}{dt}\right)\right]$$

Thus, equations 17 and 19 contain two unknowns:

$$\frac{dC_\theta}{dt} \text{ and } \frac{dC_{Li^+}}{dt}$$

From equation 17:

$$\left[\frac{dC_\theta}{dt} = \frac{1}{\alpha}\left(C\frac{d\Psi_\theta}{dt} - \beta_\theta\frac{dC_{Li^+}}{dt}\right)\right] \quad (20)$$

Substituting equation 20 into equation 19, yields:

$$\frac{d\Psi_{Li^+}}{dt} = \frac{1}{F}\left(\alpha_{Li^+}\left[\frac{1}{\alpha_\theta}\left(C\frac{d\Psi_\theta}{dt} - \beta_\theta\frac{dC_{Li^+}}{dt}\right)\right] + \beta_{Li^+}\frac{dC_{Li^+}}{dt}\right) \quad (21)$$

$$F\frac{d\Psi_{Li^+}}{dt} = \frac{\alpha_{Li^+}}{\alpha_\theta}C\frac{d\Psi_\theta}{dt} - \frac{\alpha_{Li^+}}{\alpha_\theta}\beta_\theta\frac{dC_{Li^+}}{dt} + \beta_{Li^+}\frac{dC_{Li^+}}{dt}$$

$$= \frac{\alpha_{Li^+}}{\alpha_\theta}C\frac{d\Psi_\theta}{dt} + \frac{dC_{Li^+}}{dt}\left(\beta_{Li^+} - \frac{\alpha_{Li^+}}{\alpha_\theta}\beta_\theta\right)$$

$$\therefore \left[\frac{dC_{Li^+}}{dt} = \left(F\frac{d\Psi_{Li^+}}{dt} - \frac{\alpha_{Li^+}}{\alpha_\theta}C\frac{d\Psi_\theta}{dt}\right)\left(\beta_{Li^+} - \frac{\alpha_{Li^+}}{\alpha_\theta}\beta_\theta\right)^{-1}\right]$$

Then, $$\frac{dC_\theta}{dt}$$

may be derived by substituting this result into equation 20. Recall that in this development, values for the differential terms of $\Psi_\theta$ and $\Psi_{Li^+}$ are obtained via the MSM, then utilized in equations 17-21.

2.3. Irreversible and Reversible Capacity Loss

Through additional mathematical development another tier of expressions may be derived and used to perform differential analyses and segregate capacity fade into irreversible contributions versus reversible contributions.

Irreversible losses would involve consumption of free Li+ through normal early-life SEI formation (as well as irreversible side reactions that continue over time), and would also include permanent loss or unavailability of active intercalative host material (and lithium therein) due to a number of mechanical or physical mechanisms. Reversible losses are seen more under transport limitations such as pulse-induced polarization that causes a voltage limit to be reached before full capacity is realized.

To model these losses, a baseline capacity is chosen at a low cycling rate (rlow, for example, $C_1/25$), and then an effective difference in concentration obtained at a higher rate (rhigh, for example, $C_1/1$).

$$C_{\Delta\theta} = C_\theta(r_{low}) - C_\theta(r_{high})$$

$$C_{\Delta Li^+} = C_{Li^+}(r_{low}) - C_{Li^+}(r_{high}) \quad (22a,b)$$

Base (Irreversible) changes can be represented as:

$$\Psi_{\theta,irrev} = \frac{C_\theta^0 - C_\theta(r_{low})}{C_\theta^0}; \quad (23a, b)$$

$$\Psi_{Li^+,irrev} = \frac{C_{Li^+}^0 - C_{Li^+}(r_{low})}{C_{Li^+}^0}$$

Net (Irreversible and Reversible) changes can be represented as:

$$\Psi_{\theta,net} = \frac{C_\theta^0 - C_\theta(r_{high})}{C_\theta^0}; \quad \Psi_{Li^+,net} = \frac{C_{Li^+}^0 - C_{Li^+}(r_{high})}{C_{Li^+}^0} \quad (24a, b)$$

Thus, including reversible and impedance-related changes:

$$(rev. = net - irrev.) \quad (25a, b)$$

$$\begin{bmatrix} \Psi_{\theta,rev} = \left(\frac{C_\theta(r_{low}) - C_\theta(r_{high})}{C_\theta^0}\right)_i \\ = \left(\frac{C_{\Delta\theta}}{C_\theta^0}\right)_i \\ \text{"Fraction of original } \theta \text{ that exists} \\ \text{as reversible loss under condition } i\text{"} \end{bmatrix};$$

-continued $$\Psi_{Li^+,rev} = \left(\frac{C_{Li^+}(r_{low}) - C_{Li^+}(r_{high})}{C_{Li^+}^0}\right)_i$$
$$= \left(\frac{C_{\Delta Li^+}}{C_{Li^+}^0}\right)_i$$
"Fraction of original $Li^+$ that exists as reversible loss under condition $i$"

In general terms for Li-ion capacity:

$$\Psi_{i,net} = \Psi_{\theta,net} + \Psi_{Li^+,net} \quad (26)$$
$$= (\Psi_{\theta,rev} + \Psi_{\theta,irrev}) + (\Psi_{Li^+,rev} + \Psi_{Li^+,irrev})$$
$$= (\Psi_{\theta,irrev} + \Psi_{Li^+,irrev}) + (\Psi_{\theta,rev} + \Psi_{Li^+,rev})$$
$$= (\Psi_{\theta,irrev} + \Psi_{Li^+,irrev}) + \Psi_{rev,net}$$
$$= \Psi_{irrev,net}(r_{low}) + \Psi_{rev,net}$$

Thus, $\Psi_{rev,net} \to 0$ as $r \to 0$.

Also, looking at the reversible loss due to cycling at a higher rate $$\Psi_{rev,net} = \Psi_{i,net}(r_{high}) - \Psi_{i,irrev}(r_{low}) \quad (27)$$
$$\Psi_{\theta,rev} = \Psi_{\theta,net}(r_{high}) - \Psi_{\theta,irrev}(r_{low})$$
$$\Psi_{Li^+,rev} = \Psi_{Li^+,net}(r_{high}) - \Psi_{Li^+,irrev}(r_{low}) \text{ Then}$$

$$\begin{bmatrix} C_{\Delta\theta,rev} = C_\theta(r_{low}) - C_\theta(r_{high}) \\ C_{\Delta Li^+,rev} = C_{Li^+}(r_{low}) - C_{Li^+}(r_{high}) \end{bmatrix} \text{ and} \quad (28a, b)$$

$$\left[\Psi_{\theta,rev} = \frac{C_{\Delta\theta,rev}}{C_\theta^0} \quad \& \quad \Psi_{Li^+,rev.} = \frac{C_{\Delta Li^+,rev}}{C_{Li^+}^0}\right] \text{ and} \quad (29a, b)$$

$$\begin{bmatrix} r_{\theta,rev}\left(=\frac{d}{dt}\Psi_{\theta,rev}\right) = r_{\theta,net} - r_{\theta,irrev}\left(=\frac{d}{dt}\Psi_{\theta,net} - \frac{d}{dt}\Psi_{\theta,irrev}\right) \\ r_{Li^+,rev}\left(=\frac{d}{dt}\Psi_{Li^+,rev}\right) = r_{Li^+,net} - r_{Li^+,irrev}\left(=\frac{d}{dt}\Psi_{Li^+,net} - \frac{d}{dt}\Psi_{Li^+,irrev}\right) \end{bmatrix} \quad (30a, b)$$

Then for the rates of reversible components, based on the CK-desired molor concentration scale:

$$\begin{bmatrix} r_{C_{\Delta\theta,rev}} = \frac{d}{dt}C_{\Delta\theta,rev} = \frac{d}{dt}C_{\theta,irrev} - \frac{d}{dt}C_{\theta,net} = r_{C_{\theta,net}} - r_{C_{\theta,irrev}} \\ r_{C_{\Delta Li^+,rev}} = \frac{d}{dt}C_{\Delta Li^+,rev} = \frac{d}{dt}C_{Li^+,irrev} - \frac{d}{dt}C_{Li^+,net} = r_{C_{Li^+,net}} - r_{C_{Li^+,irrev}} \end{bmatrix} \quad (31a, b)$$

2.4. Establishing Time-Zero Values as Baseline Quantities

Beginning-Of-Life (BOL) (i.e., time zero) is a reference condition that figures centrally in the previous analytical development. For example, concentration and related $\Psi$ terms might require an offset due to polarization effects experienced at higher cycling rates. A low-rate cycling condition (e.g., rlow=C1/25) can be used to set the context for defining BOL terms, wherein an arbitrary cycling condition denoted by a (r*) is considered:

$$\Psi_i^0(r^*) = \frac{\Omega(r_{low}) - \Omega(r^*)}{\Omega(r_{low})} \quad (32)$$

where $\Omega$ is the BOL achievable capacity at the indicate rate for condition i.

$$\Psi_\theta^0(r^*) = \Psi_i^0(r^*)\left(\frac{C_{Li^+}^0}{C_\theta^0 + C_{Li^+}^0}\right)_{r_{low}}; \quad (33a, b)$$

$$\Psi_{Li^+}^0(r^*) = \Psi_i^0(r^*)\left(\frac{C_\theta^0}{C_\theta^0 + C_{Li^+}^0}\right)_{r_{low}}$$

Another definition of BOL quantities at arbitrary r*, may be defined for $\theta$, as:

$$\Psi_\theta^0(r^*) = \left(\frac{C_\theta^0(r_{low}) - C_\theta^0(r^*)}{C_\theta^0(r_{low})}\right) \text{ and likewise for } \Psi_{Li^+}^0(r^*). \quad (34a, b)$$

Equating the previous two expression for $\theta$ gives:

$$C_\theta^0(r^*) = \quad (35a, b)$$
$$C_\theta^0(r_{low})\left[1 - \Psi_i^0(r^*)\left(\frac{C_{Li^+}^0}{C_\theta^0 + C_{Li^+}^0}\right)_{r_{low}}\right] \text{ and likewise for } C_{Li^+}^0(r^*).$$

Thus, relevant BOL values for concentration and related $\Psi$ terms can be estimated at an arbitrary cycling rate (C1/1, C1/3, 2C1, etc.). In practice, these BOL values may be incorporated into the generalized expressions, for example:

$$\Psi_i(r^*) = \overline{\Psi}_\theta + \overline{\Psi}_{Li^+} + \overline{\Psi}_{source} + \Psi_i^0(r^*) = \overline{\Psi}_{\theta,net} + \overline{\Psi}_{Li^+,net}$$

e.g., $\overline{\Psi}_{Li^+,net} = \overline{\Psi}_{Li^+,loss} + \overline{\Psi}_{Li^+,source} + \overline{\Psi}_{Li^+}^0(r^*) \quad (36)$ The low-rate cycling basis (C1/25) is chosen out of a compromise between timely measurement and the desire to obtain pseudo-equilibrium characterization. An additional basis can be adopted to look at a slower baseline (e.g., C1/50) or the theoretical maximum "design-rated" capacity, to see how far the C1/25 basis differs with a theoretical baseline.

2.5. Relating MSM Results to General CK Reaction Rate Expressions

MSM rate expressions can be linked to expressions dealing with chemical kinetics reaction rates, using conventional CK forms:

Considering the overall rate of change in capacity loss at condition i:

$$r_i^{CK} \equiv k_{net}^{CK}(\Psi_{net})^{m_{net}^{CK}} \stackrel{!}{=} \left(\frac{d\Psi_i}{dt}\right)_{MSM} \quad (37)$$

Considering θ and Li+:

$$r_\theta^{CK} \equiv k_\theta^{CK}(\Psi_\theta)^{m_\theta^{CK}} \stackrel{!}{=} \left(\frac{d\Psi_\theta}{dt}\right)_{MSM}; \quad (38)$$

$$r_{Li^+}^{CK} \equiv k_{Li^+}^{CK}(\Psi_{Li^+})^{m_{Li^+}^{CK}} \stackrel{!}{=} \left(\frac{d\Psi_{Li^+}}{dt}\right)_{MSM}$$

Then:

$$r_i^{CK} \equiv k_\theta^{CK}(\Psi_\theta)^{m_\theta^{CK}} + k_{Li^+}^{CK}(\Psi_{Li^+})^{m_{Li^+}^{CK}} \stackrel{!}{=} \left(\frac{d\Psi_\theta}{dt}\right)_{MSM} + \left(\frac{d\Psi_{Li^+}}{dt}\right)_{MSM} \quad (39)$$

Analogous forms to equations 37-39 can be written using concentration scales in place of Ψ terms. In most cases the rates are variable over time, and the case of constant rate is only an idealized scenario not assumed or imposed herein.

3. Demonstration of Model Capability

FIGS. 5A-12 illustrate experimental data and their correlations to MSM model predictions for various batteries and under various test conditions. The data shown is for discharge capacity, obtained by full discharge from 100% SOC to 0% SOC at the cycling rates indicated in the various figures.

Unless otherwise noted, MSM regression utilized a two-term approach, including one sigmoid expression each for loss of active host sites (θ) over time and loss of free lithium (Li+) over time. In cases of $C_1/1$ capacity fade, the time-zero offset was included (i.e., $C'_1/1$ capacity fade as illustrated in FIG. 3) to account for the transport limitations that arise when going from a $C_1/25$ rate to $C_1/1$.

Figure 5A:
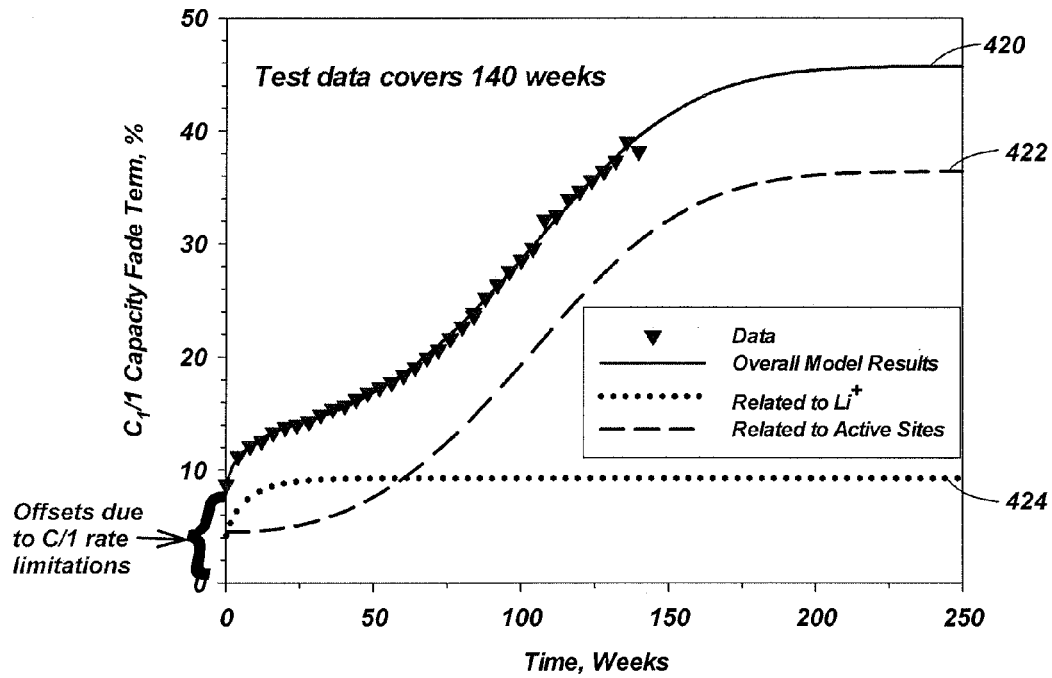
FIGS. 5A and 5B illustrate overall, irreversible, and reversible C1/1 capacity loss terms for electrochemical cells cycle-life tested at 25° C. and 60% SOC.
Figure 5B:
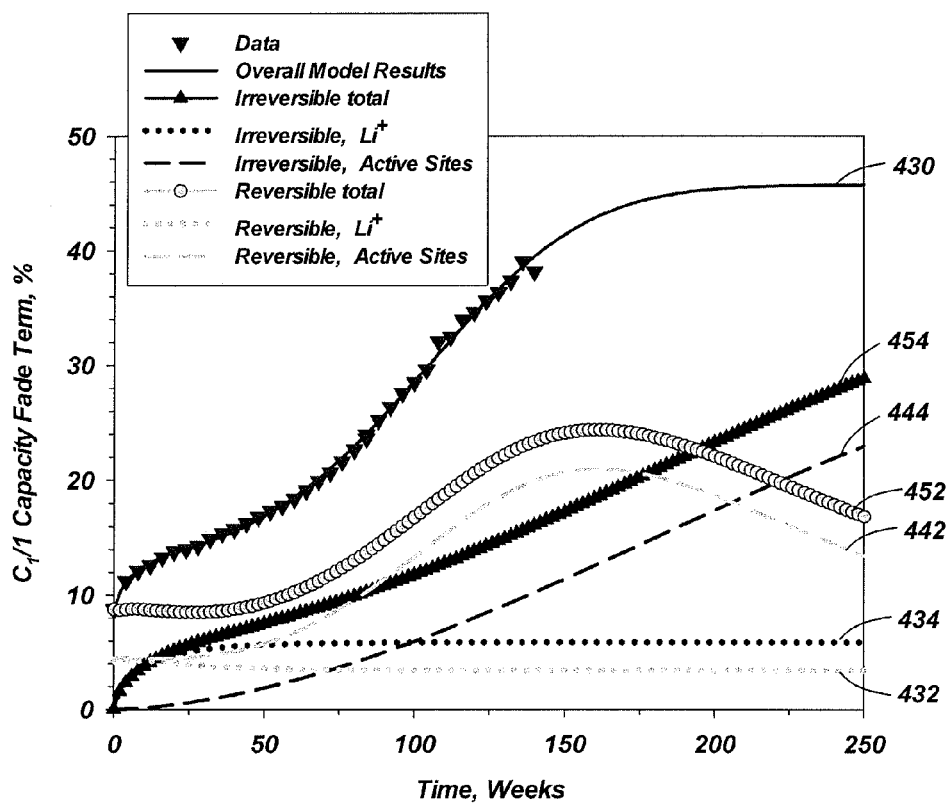

FIGS. 5A and 5B illustrate overall, irreversible, and reversible C1/1 capacity loss terms for electrochemical cells cycle-life tested at 25° C. and 60% SOC.

Note that herein the term "loss" refers to net unavailability of Li+ or active host sites, under the characterization condition, due to a host of mechanisms including consumption from reactions, physical/mechanical degradation of Li+ ingress and egress paths, related transport limitations, etc. The initial offset in FIG. 5A is simply due to the difference in BOL capacity between C1/1 and C1/25 rates.

FIG. 5A illustrates empirical data representing capacity fade collected over 140 weeks as illustrated by the triangle data points. Line 420 shows a multiple sigmoid model for the capacity fade. Line 422 shows the sigmoid expression related to active sites and line 424 shows the sigmoid expression related to free lithium. A combination of line 422 and line 424 generates the MSM of line 420. As can be seen, contribution to capacity fade due to loss of free lithium increases early in the life cycle then plateaus and is relatively constant. In contrast, the contribution to capacity fade due to loss of active host sites begins with little change, accelerates mid-life, then plateaus near the end of life. It can be seen that early fade is tied more to lithium loss mechanisms (as suspected), which tend to plateau early and are then eclipsed by mechanisms affecting active host sites.

The model predicts that the overall fade will plateau at a magnitude less than 100% fade, which is reasonable when it is considered that chemical reaction processes in a batch system have kinetic and thermodynamic limitations that affect the extent of reaction, given an aging test condition.

The MSM model may be developed based on a relatively few number of empirical data points to develop coefficients for the sigmoid expressions. As more data is gathered, the model can be refined with minor changes to the coefficients.

Table 1 shows coefficient data based on regression of the model over the "test data range" column. The first column indicates cell type and environmental conditions; the second column indicates the cycling rate. The third column indicates the sigmoid expression. Thus, the rows for θ include coefficients for the sigmoid expression modeling active host sites and the rows for Li+ include coefficients for the sigmoid expression modeling free lithium sigmoid expression. The coefficients aj, bj, and Mj are the coefficients for the sigmoid expression to use for equations, such as, equations 10c for loss of active host sites and 10d for loss of free lithium.

TABLE 1

MSM parameters for regression of Gen2 data.

| Aging Test Condition | Cycling Rate | j | $a_j$ [weeks$^{-bj}$] | $b_j$ | $M_j$ [%] | Test data range (wks) |
|---|---|---|---|---|---|---|
| cycL at 25° C., 60% SOC | $C_1/25$ | θ | $1.564 \times 10^{-4}$ | 1.6763 | 34.1035 | 140 |
| (baseline cells) | | Li+ | 0.3520 | 0.6211 | 5.8965 | 140 |
| cycL at 45° C., 60% SOC | $C_1/25$ | θ | $4.535 \times 10^{-5}$ | 2.1787 | 36.363 | 68 |
| (baseline cells) | | Li+ | 0.4409 | 0.4993 | 13.000 | 68 |
| cycL at 45° C., 60% SOC | $C_1/25$ | θ | $6.465 \times 10^{-5}$ | 1.9112 | 26.000 | 124 |
| (VARC cells) | | Li+ | 0.1381 | 0.6698 | 12.000 | 124 |
| | | source | $8.632 \times 10^{-7}$ | 3.960 | −2.4227 | 124 |
| cycL at 25° C., 60% SOC | $C_1/1$ | θ | $1.856 \times 10^{-5}$ | 2.3662 | 31.9019* | 140 |
| (baseline cells) | | Li+ | 0.3750 | 0.6994 | 5.0981* | 140 |

TABLE 1-continued

MSM parameters for regression of Gen2 data.

| Aging Test Condition | Cycling Rate | j | $a_j$ [weeks$^{-bj}$] | $b_j$ | $M_j$ [%] | Test data range (wks) |
|---|---|---|---|---|---|---|
| cycL at 45° C., 60% SOC (baseline cells) | $C_1/1$ | θ | $5.115 \times 10^{-6}$ | 3.0368 | 25.000* | 68 |
|  |  | Li⁺ | 0.3507 | 0.4373 | 11.000* | 68 |
| cycL at 45° C., 60% SOC (VARC cells) | $C_1/1$ | θ | $4.220 \times 10^{-5}$ | 2.0833 | 22.0972* | 124 |
|  |  | Li⁺ | 0.1011 | 0.7220 | 10.7722* | 124 |
|  |  | source | $1.745 \times 10^{-3}$ | 1.9282 | −5.7582 | 124 |

*plus applicable BOL offset unique to each aging test condition.

FIG. 5B illustrates empirical data representing capacity fade collected over 140 weeks as illustrated by the triangle data points. In FIG. 5B, the MSM includes elements to model irreversible and reversible portion that contribute to capacity loss for each of loss of active host sites and loss of free lithium. Line 430 shows a multiple sigmoid model for the total capacity fade.

Line 432 shows model analysis results for the reversible contribution related to loss of free lithium. Line 442 shows model analysis results for the reversible contribution related to loss of active host sites. Line 452 is a combination of lines 432 and 442 to show total reversible loss due to both loss of active host sites and loss of free lithium.

Line 434 shows model analysis results for the irreversible contribution related to loss of free lithium. Line 444 shows model analysis results for the irreversible contribution related to loss of free lithium. Line 454 is a combination of lines 434 and 444 to show total irreversible loss due to both loss of active host sites and loss of free lithium.

Line 430 shows the combination of all terms to generate the total result of the MSM. As can be seen in FIG. 5B, reversible losses dominate during early testing while irreversible losses dominate later (well past the 140 week test period). Overall, it is the capacity performance tied to active sites that dominates the effective capacity loss. Reversible contributions to capacity fade dominate at early time, are tied primarily to active sites, and undergo a maximum at around 150 weeks. In comparison, irreversible losses grow steadily over the time period. Collectively, FIGS. 3A-3C, 5A and 5B show that C1/1 capacity fade is dominated by mechanisms that impact active sites, initially by reversible mechanisms through about 180 weeks, then by irreversible mechanisms thereafter. Loss of free Li+ plays a major role in C1/1 capacity fade in these cells only in early life (<50 weeks). Such model results support cell diagnostics and dynamic predictions of performance for given service time goals.

It can be seen that the MSM provides extremely high fidelity in capturing the data trends. Such accuracy allows a solid basis on which to perform diagnostic analyses for determining contributions from θ and Li+, reversible and irreversible contributions, and related quantities. For example, if a battery is failing early in its intended application, graphs such as FIG. 5B can show what is likely contributing to the failure, then improvements can be made to the battery. Furthermore, extrapolations and interpolations can easily and accurately be performed to predict capacity fade at various points in time along the MSM curves 420 and 430.

For a batch system like a lithium-ion cell, the rates of chemical reactions that affect active sites depend on how many remaining active sites and reactants there are over time, since the active sites can facilitate, catalyze, or moderate these reactions. Thus, batch reactions that are reactant-promoted and product-moderated can be expected to manifest a sigmoid-type profile in the extent of reaction(s) involved.

Regarding charge versus discharge performance, comparison of the charge and discharge capacities and related MSM parameters at a given cycling rate will give clear indications of which mode is more limiting over time in a kinetic sense, and whether such limitations are tied more to θ or Li⁺.

Figure 6A:
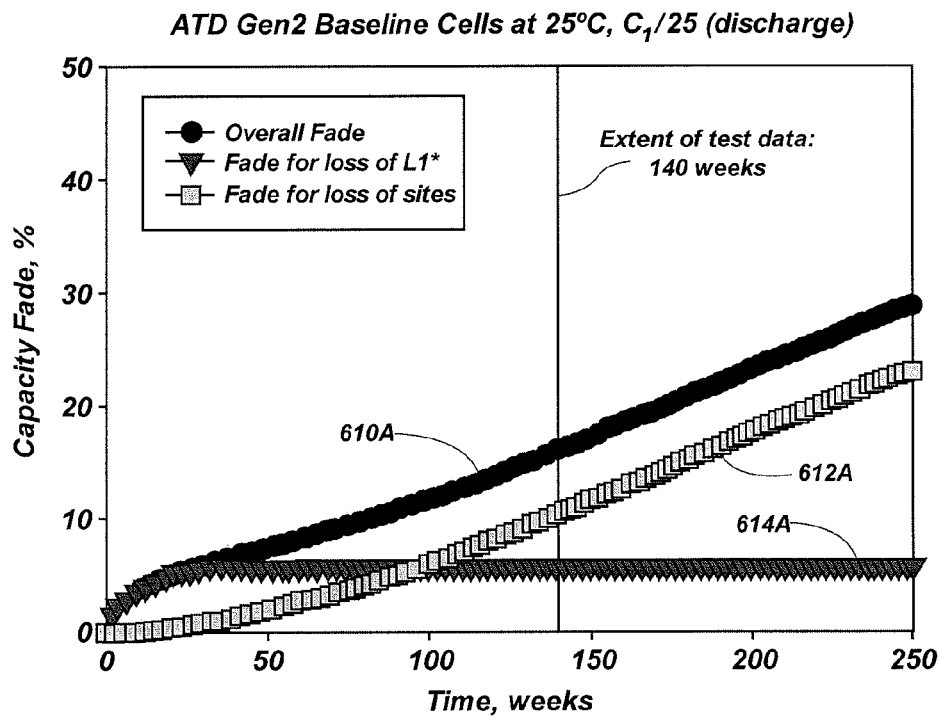
FIGS. 6A-6F illustrate data from analyses of MSM for Gen2 cells cycle-life tested at 25° C. and 60% SOC, comparing C1/25 and C1/1 cycling rates.
Figure 6B:
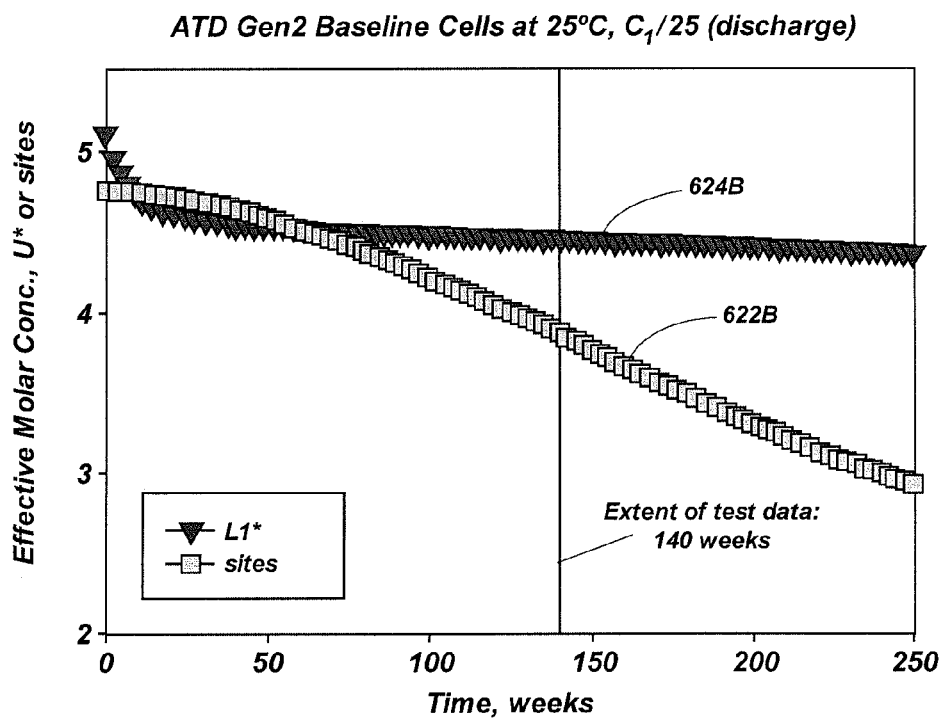
Figure 6C:
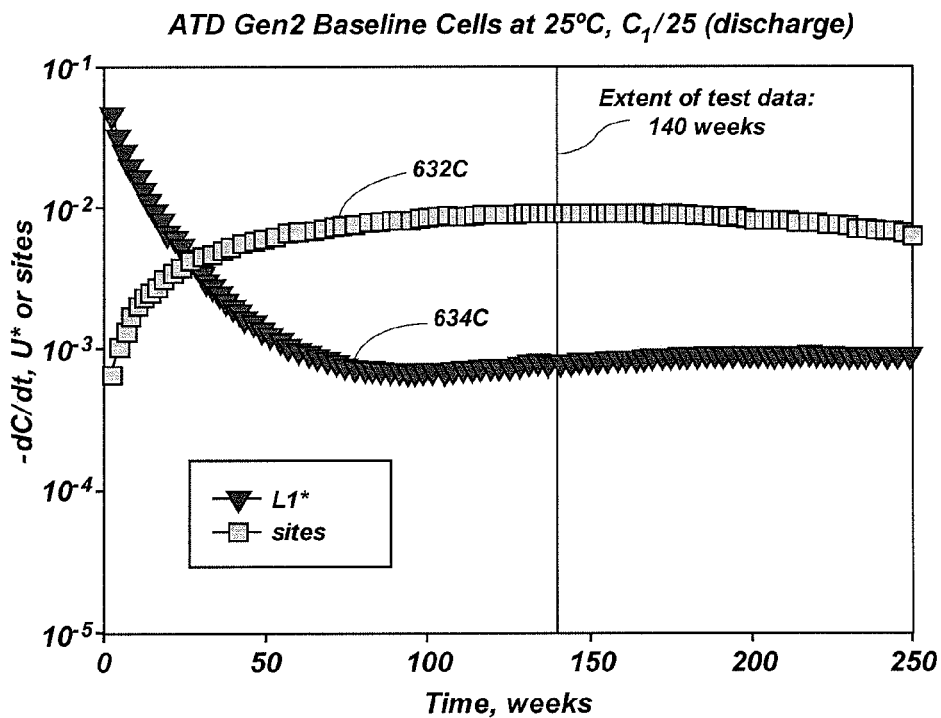
Figure 6D:
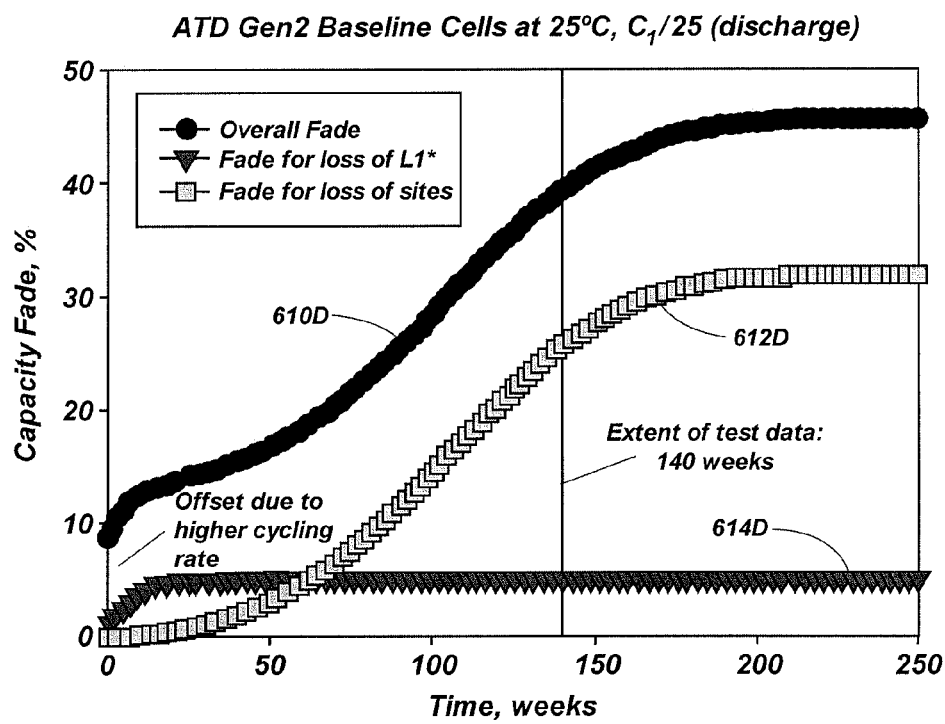
Figure 6E:
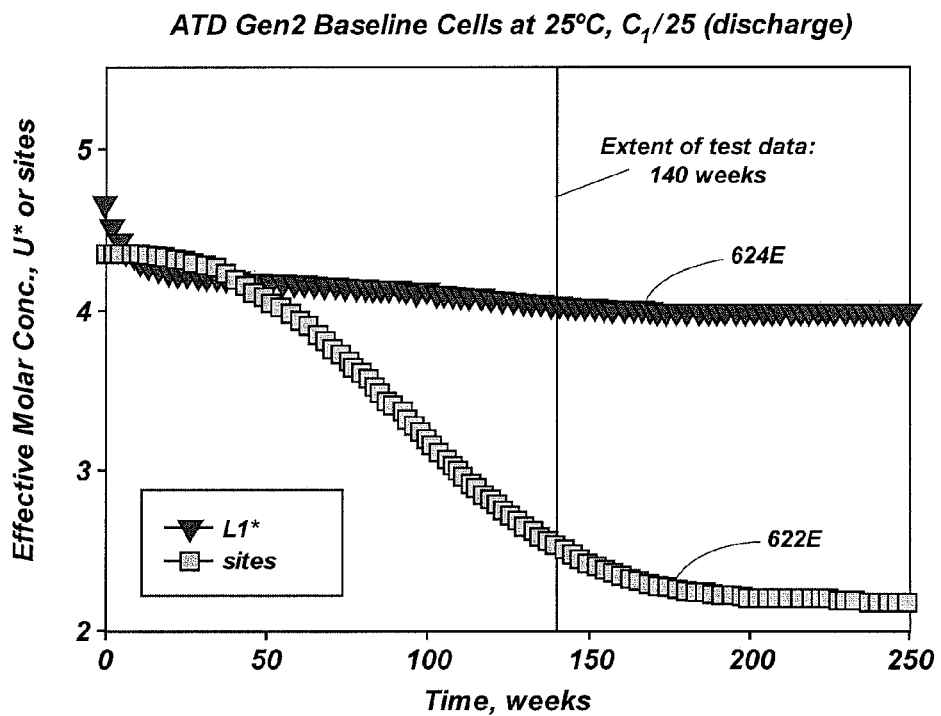
Figure 6F:
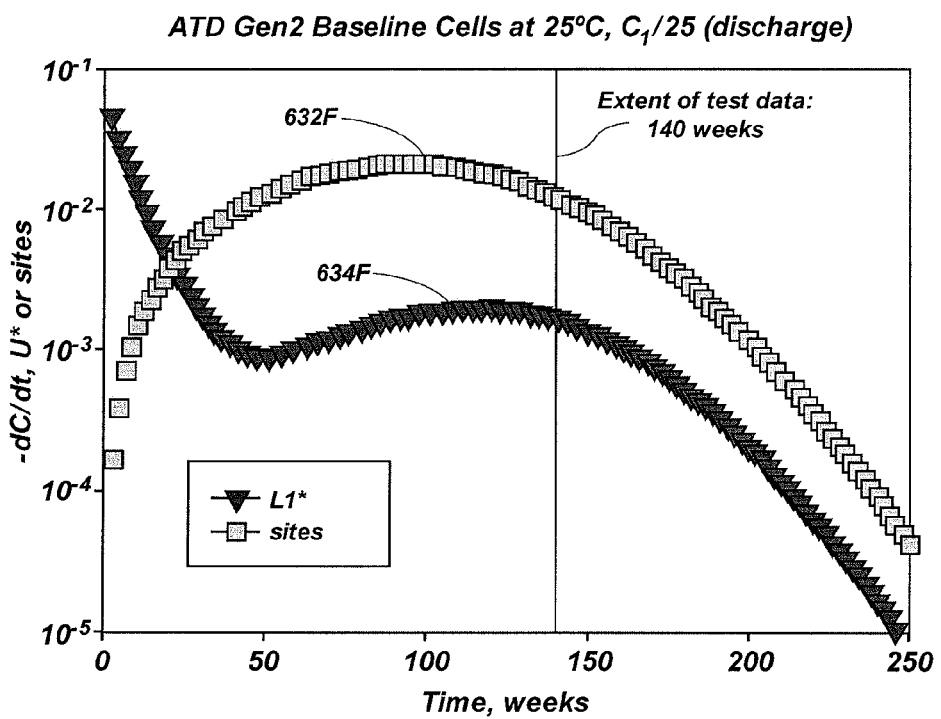

FIGS. 6A-6F illustrate data from analyses of MSM for Gen2 cells cycle-life tested at 25° C. and 60% SOC. FIGS. 6A-6C show model analysis results with a cycling rate of $C_1/25$ and FIGS. 6C-6F show model analysis results with a cycling rate of $C_1/1$. The top graphs (FIGS. 6A and 6D) show overall capacity fade (610A and 610D), capacity fade due to loss of active host sites (612A and 612D) and capacity fade due to loss of free lithium (614A and 614D).

The middle two graphs show model analysis results related to effective molar concentrations for active host sites (622B and 622E) and effective molar concentrations for free lithium (624B and 624E). These effective molar concentrations may be derived from equations 8a, b, and c above.

The bottom two graphs show derivative results for time rate of change related to effective molar concentrations for active host sites (632C and 632F) and derivative results for time rate of change related to effective molar concentrations for free lithium (634C and 634F). These time rate of change results are the derivates of the results show in FIGS. 6B and 6E, and are obtained from equations 17-21 above.

Figure 7A:
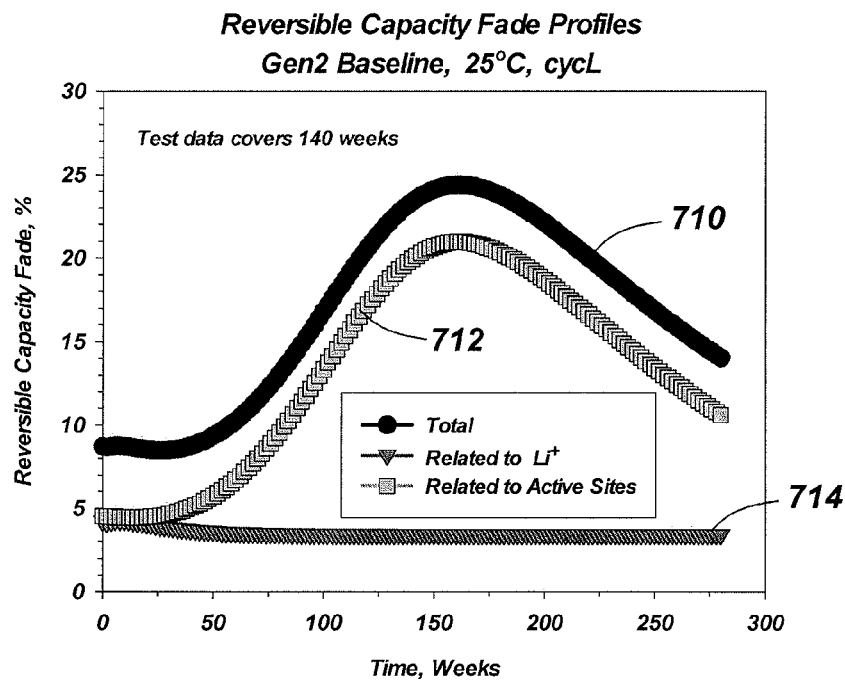
FIGS. 7A-7C illustrate data from analyses of MSM for Gen2 cells cycle-life tested at 25° C. and 60% SOC.
Figure 7B:
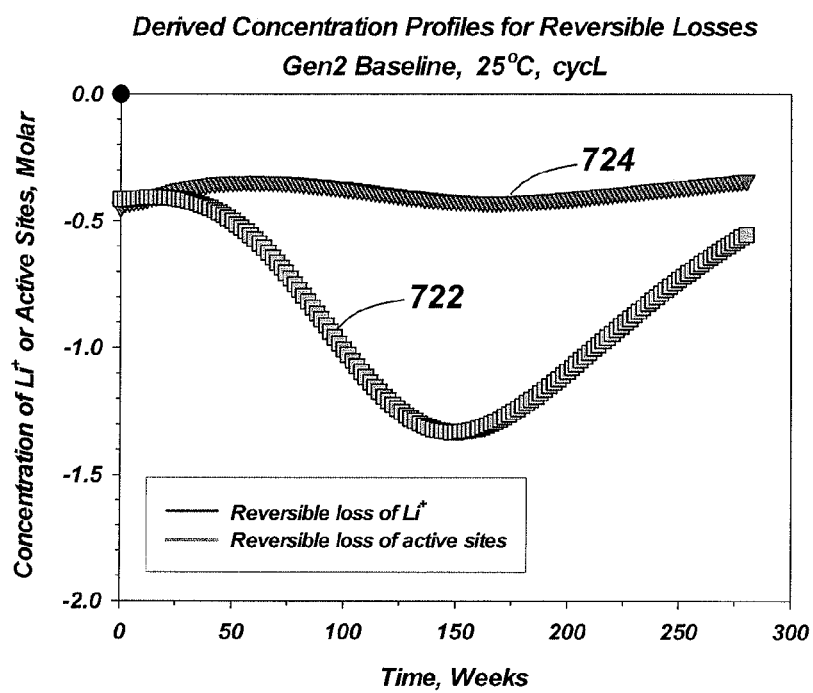
Figure 7C:
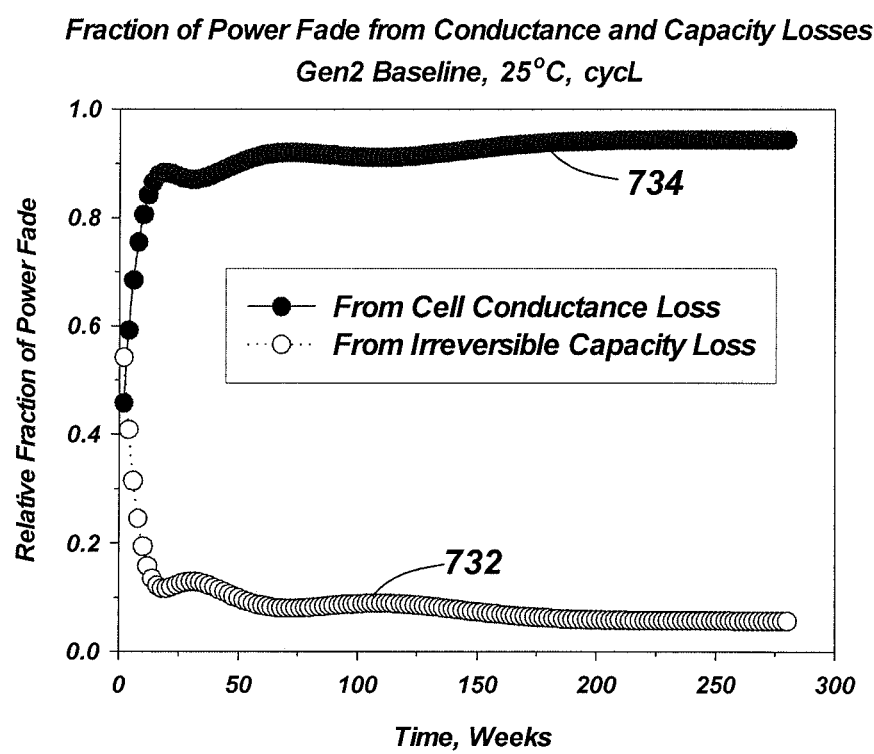
Figure 8A:
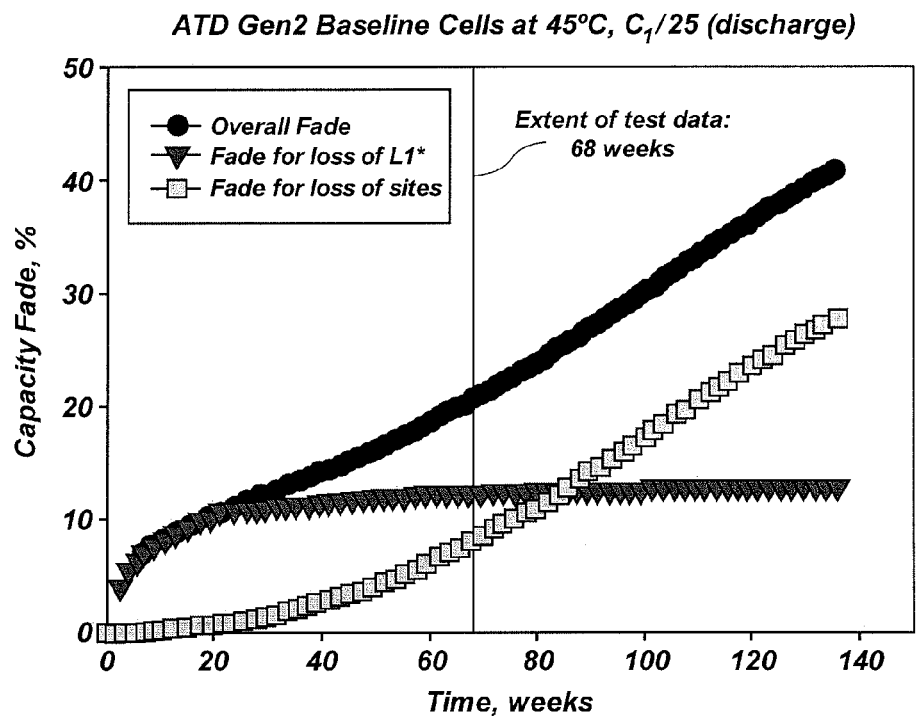
FIGS. 8A-8F illustrate data from analyses of MSM for Gen2 cells cycle-life tested at 45° C. and 60% SOC, comparing C1/25 and C1/1 cycling rates.
Figure 8B:
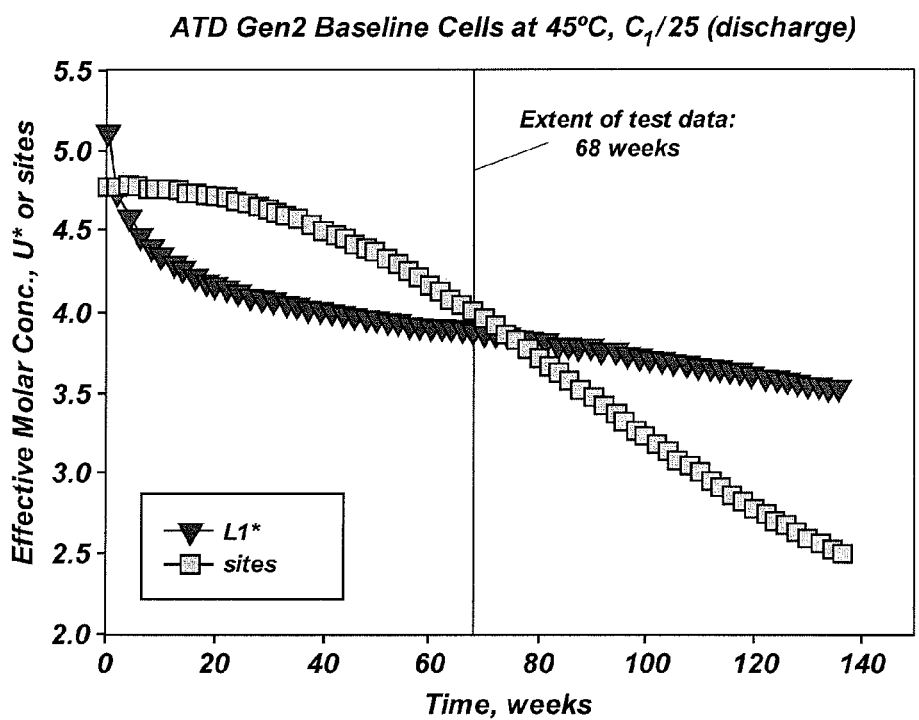
Figure 8C:
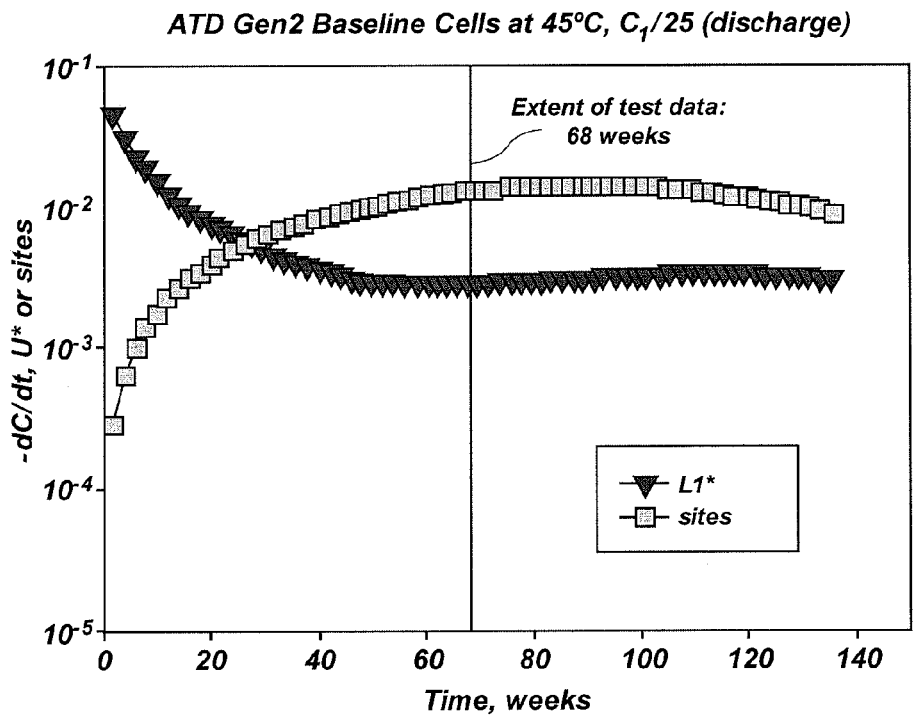
Figure 8D:
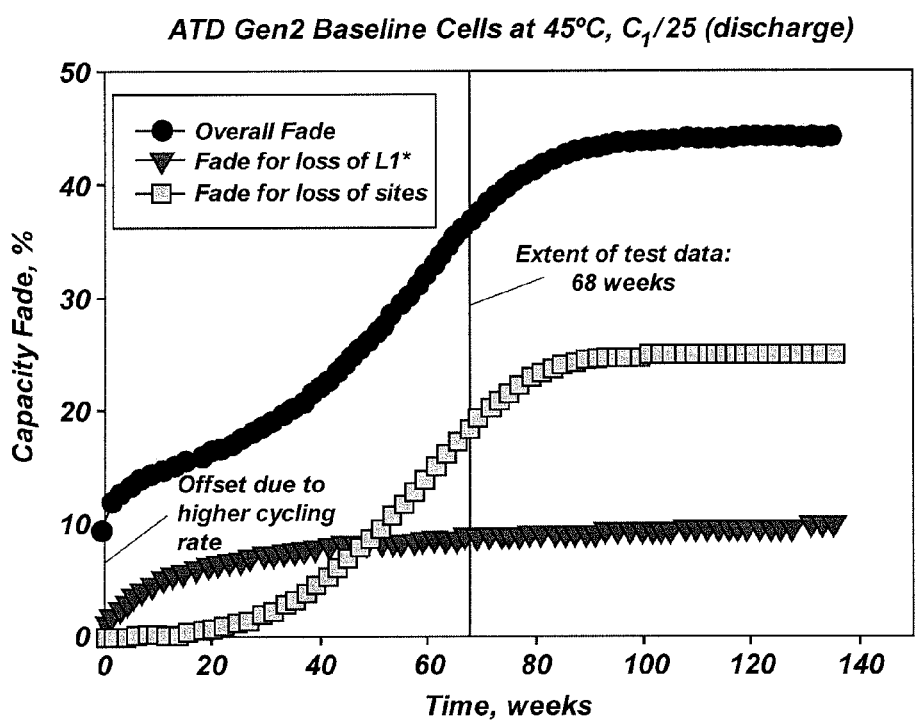
Figure 8E:
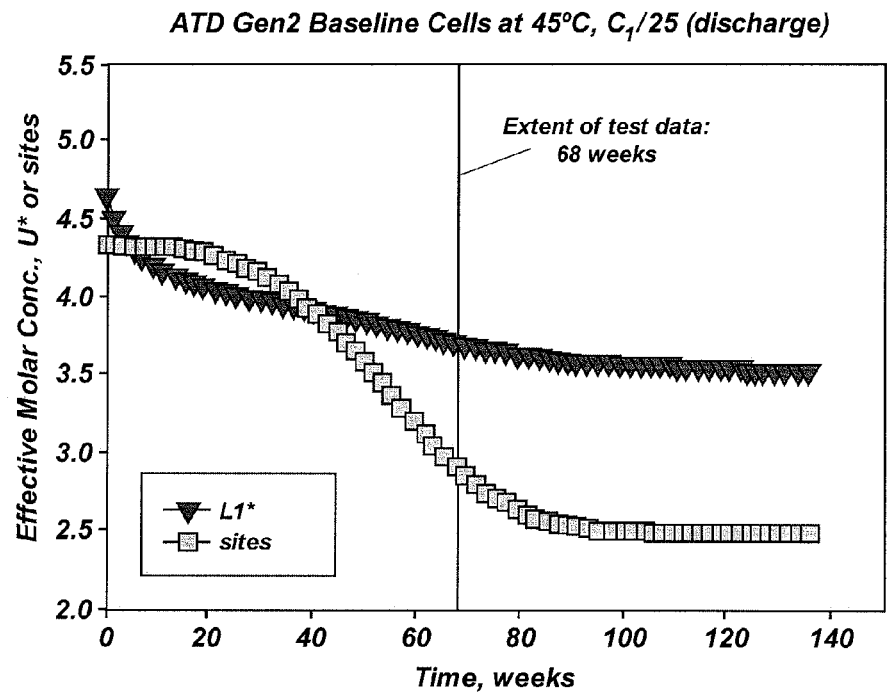
Figure 8F:
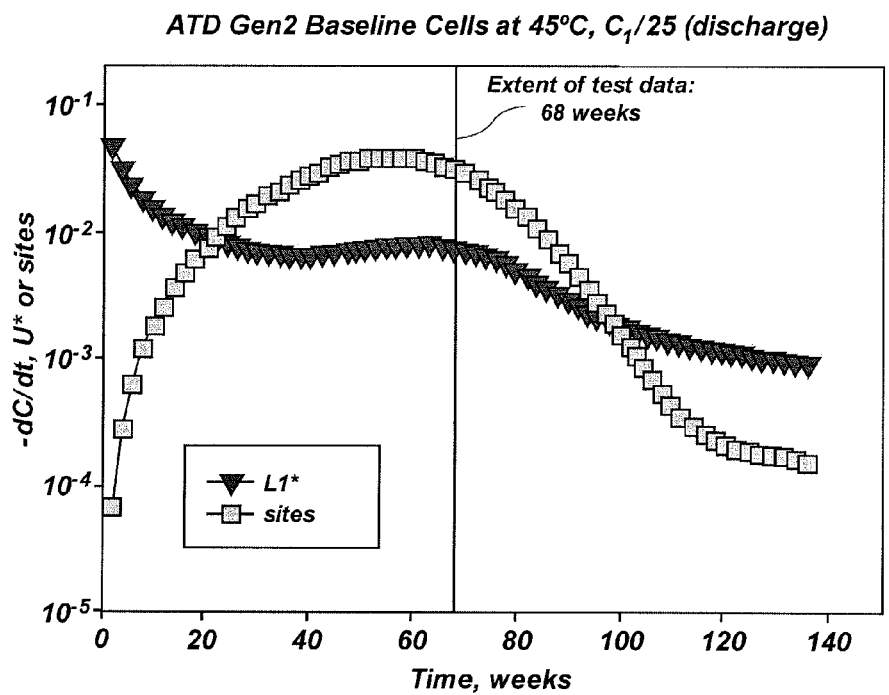

FIGS. 7A-7C illustrate various data from analyses of MSM for Gen2 cells cycle-life tested at 25° C. and 60% SOC. FIG. 7A shows overall reversible capacity fade 710, reversible capacity fade due to loss of active host sites 712A, and reversible capacity fade due to loss of free lithium 714A. These quantities are determined through equations 25a and 25b.

FIG. 7B shows molar concentrations related to reversible loss of active host sites 722 and molar concentrations related to reversible loss of free lithium 724. These quantities are determined through equations 22a and 22b.

In FIG. 7C, curve 732 illustrates the relative fraction of power fade due to capacity loss and curve 734 illustrates the relative fraction of power fade due to cell conductance loss. It can be seen that the capacity contribution is greatest at early testing life, and hence tracks with the irreversible loss of free Li+. This segregation is accomplished by subtracting from unity the ratio of conductance loss to power loss, which yields the capacity contribution to power loss:

$$\text{(Fraction of Power Loss Due to Capacity Loss } (t)) \simeq 1 - \left(\frac{\text{Fractional Conductance Loss } (t)}{\text{Fractional Power Loss } (t)}\right) = 1 - \frac{\Psi_K(t)}{\Psi_P(t)} \quad (40)$$

where the right-hand-side ratio indicates usage of MSM-based values for overall conductance loss and power loss over time. It should be noted that the choice of the power goal will have some bearing on the relative contributions from conductance and capacity fades. In other words, power loss may be determined relative to a power goal. If operation of a battery is desired at a certain watt-hour goal, then power loss can be assessed relative to that goal. Thus, the ratio of conductance loss over power loss is determined and whatever is remaining is the fraction of power loss due to capacity fade.

Conductance loss may be determined in a number of ways. As an example, hybrid-pulse power characterization HPPC uses a short pulse of constant current injected into the battery. At the end of the pulse, a voltage drop associated with the current pulse indicates a resistance of the battery. Conductance may be derived as the inverse of the resistance.

As another example, Electrochemical Impedance Spectroscopy (EIS) may be used to analyze battery impedance. EIS generates a sine excitation waveform at a specific frequency that is applied to the battery. The voltage and current responses are monitored and analyzed to arrive at battery impedance for that particular frequency. Then, the frequency of the sine excitation signal is modified over a range of frequencies to arrive at a frequency spectrum of the battery impedance. Resistance may be derived as the real part of impedance and therefore conductance may be derived as the inverse of resistance. This process provides stable, accurate measurements of battery impedance, but is most practical for laboratory conditions, or when the battery can be disconnected from operational loads. In other words, EIS may not work well when the battery is under changing loads as changes imposed upon the sine wave excitation may skew the results.

FIGS. 8A-8F illustrate data from analyses of MSM for Gen2 cells cycle-life tested at 45° C. and 60% SOC. FIGS. 8A-8F are similar to FIGS. 6A-6F except that the data is determined at 45° C. in FIGS. 8A-8F rather than the 25° C. of FIGS. 6A-6F. Therefore, the description for FIGS. 6A-6F may be applied to FIGS. 8A-8F with the same relative curves apparent without using element designators for each curve.

Figure 9A:
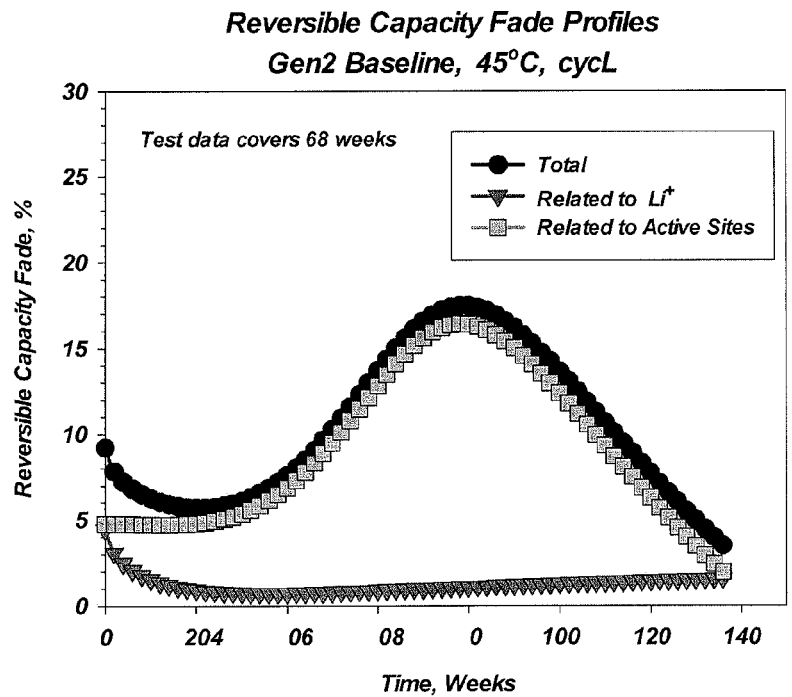
FIGS. 9A-9C illustrate data from analyses of MSM for Gen2 cells cycle-life tested at 45° C. and 60% SOC.
Figure 9B:
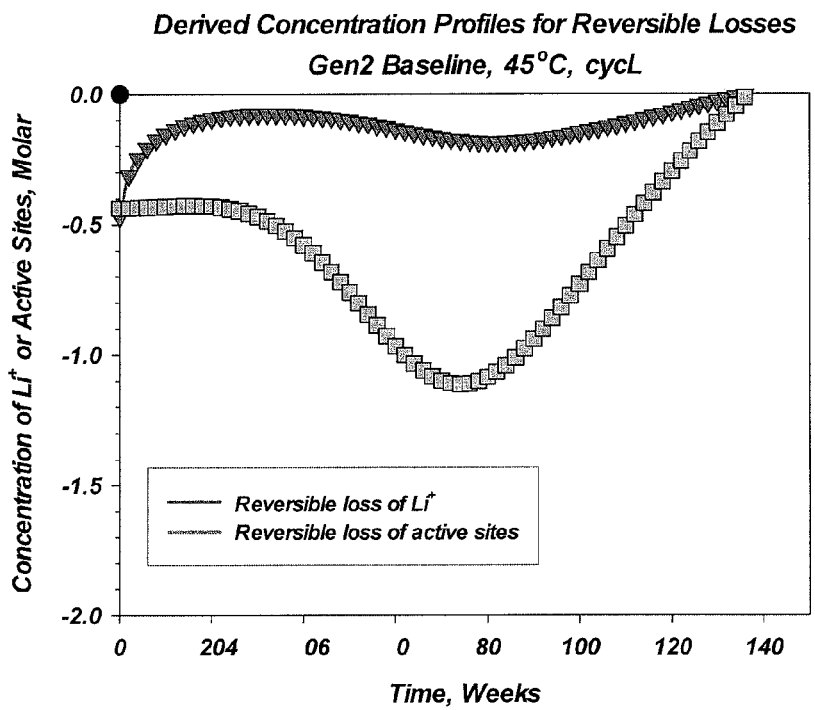
Figure 9C:
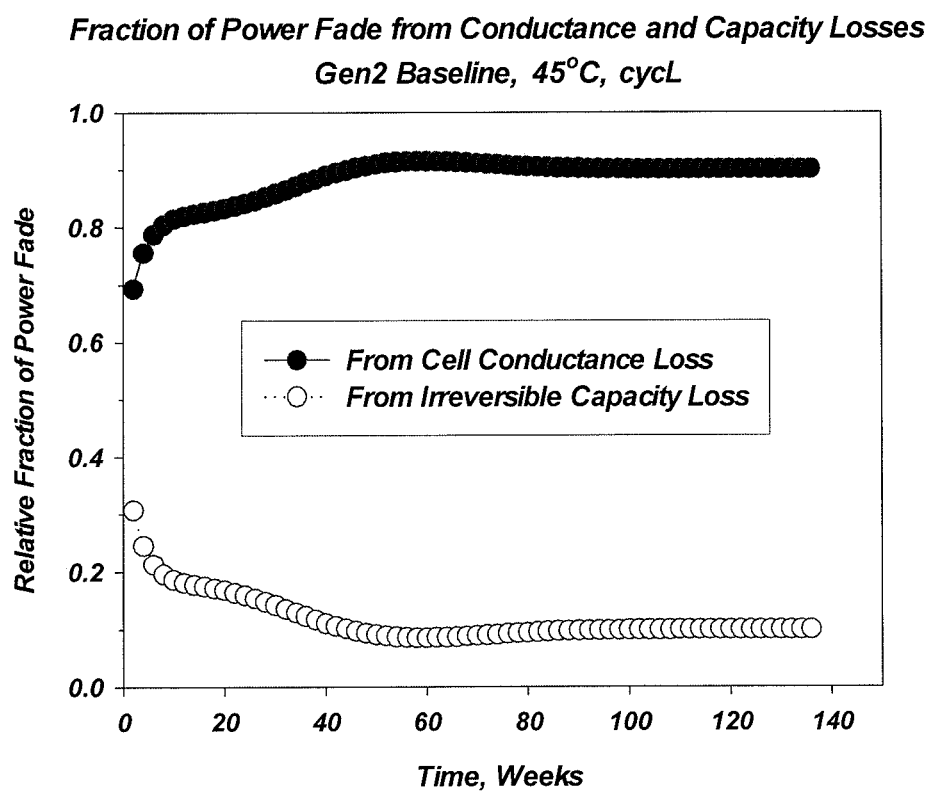
Figure 10A:
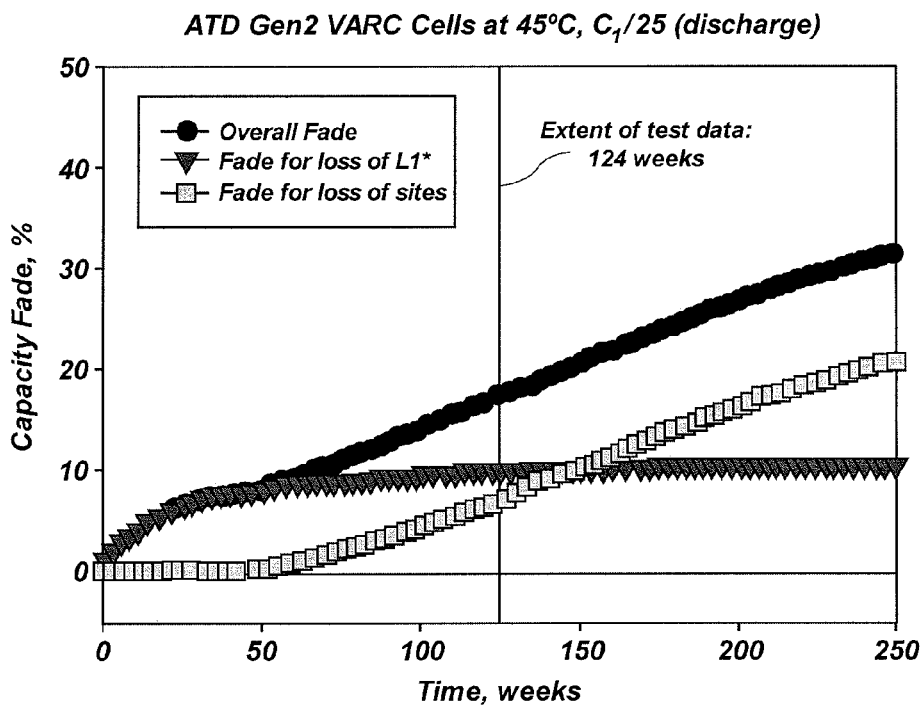
FIGS. 10A-10F illustrate data from analyses of MSM for Gen2 VARC cells cycle-life tested at 45° C. and 60% SOC.
Figure 10B:
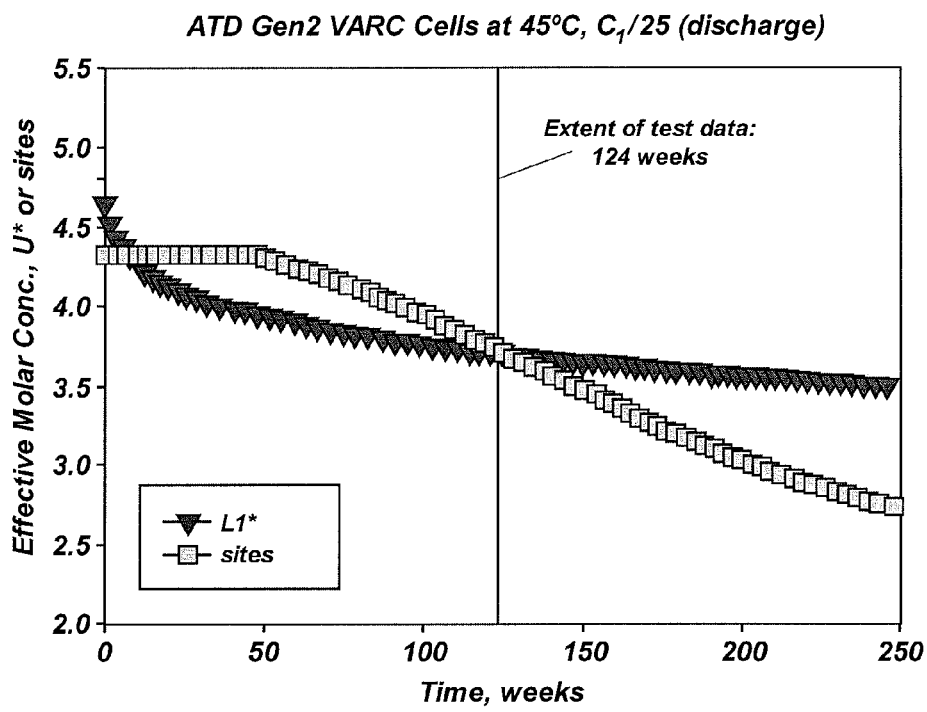
Figure 10C:
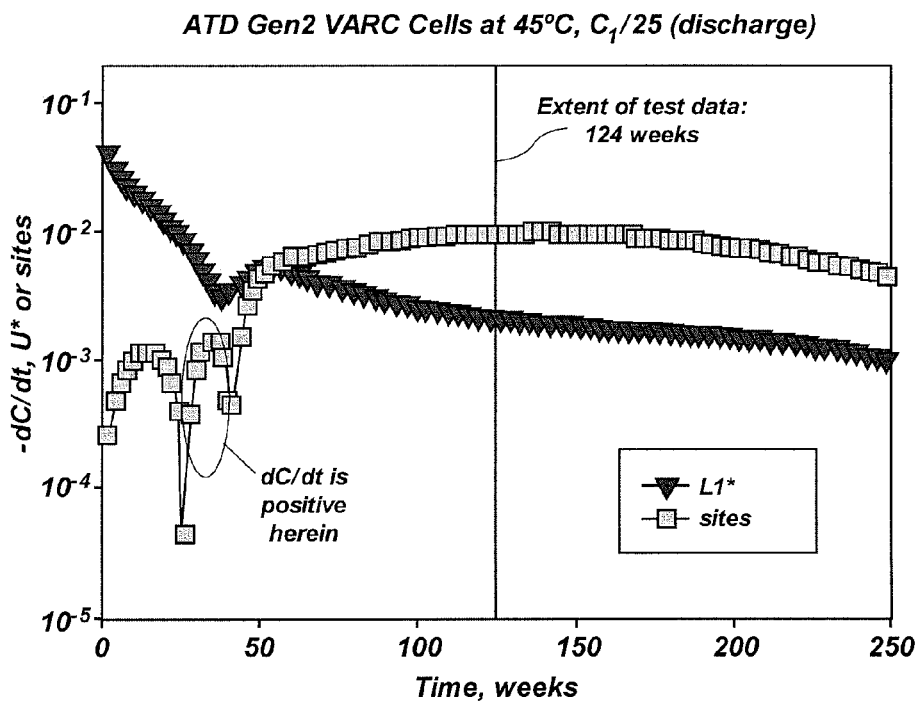
Figure 10D:
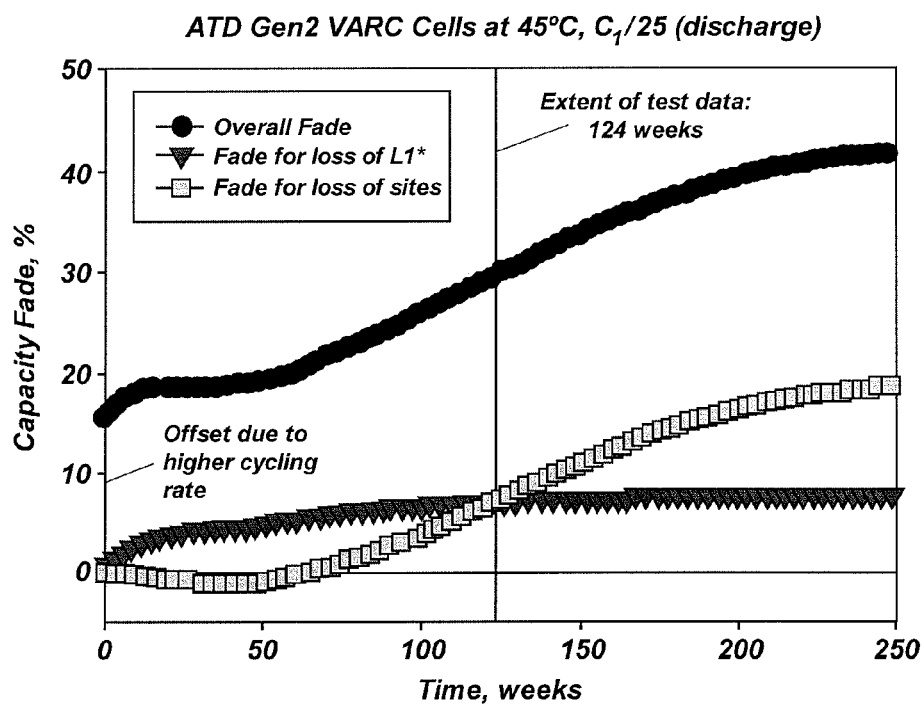
Figure 10E:
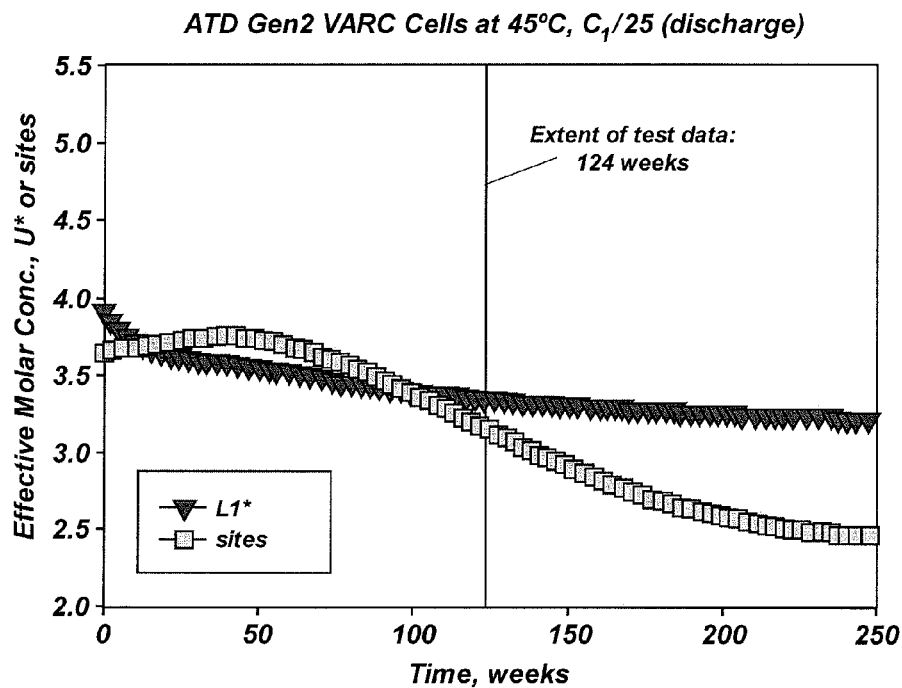
Figure 10F:
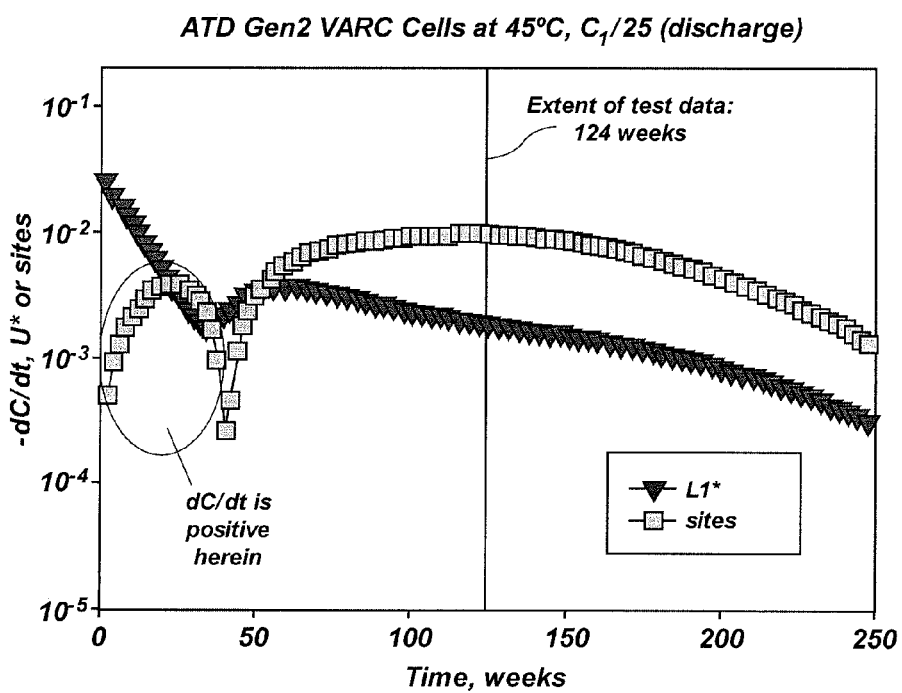

FIGS. 9A-9C illustrate data from analyses of MSM for Gen2 cells cycle-life tested at 45° C. and 60% SOC. FIGS. 9A-9C are similar to FIGS. 7A-7C except that the data is determined at 45° C. in FIGS. 9A-9C rather than the 25° C. of FIGS. 7A-7C. Therefore, the description for FIGS. 7A-7C may be applied to FIGS. 9A-9C with the same relative curves apparent without using element designators for each curve.

FIGS. 10A-10F illustrate data from analyses of MSM for Gen2 VARC cells cycle-life tested at 45° C. and 60% SOC. FIGS. 10A-10F are similar to FIGS. 6A-6F except that the data is determined at 45° C. and for Gen2 VARC cells in FIGS. 10A-10F rather than the 25° C. and Gen2 cells of FIGS. 6A-6F. Therefore, the description for FIGS. 6A-6F may be applied to FIGS. 10A-10F with the same relative curves apparent without using element designators for each curve.

Figure 11A:
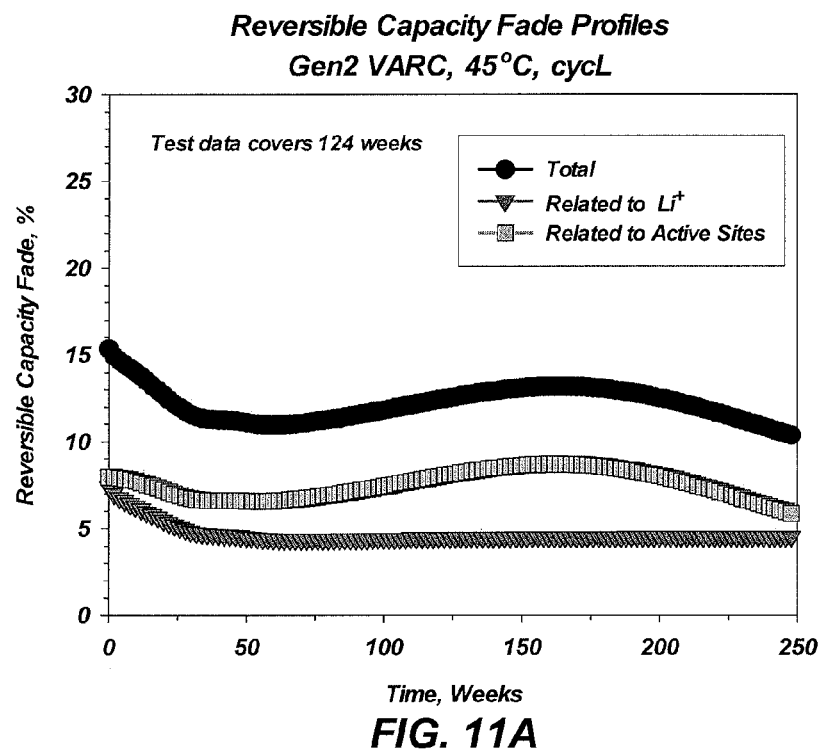
FIGS. 11A-11C illustrate data from analyses of MSM for Gen2 VARC cells cycle-life tested at 45° C. and 60% SOC.
Figure 11B:
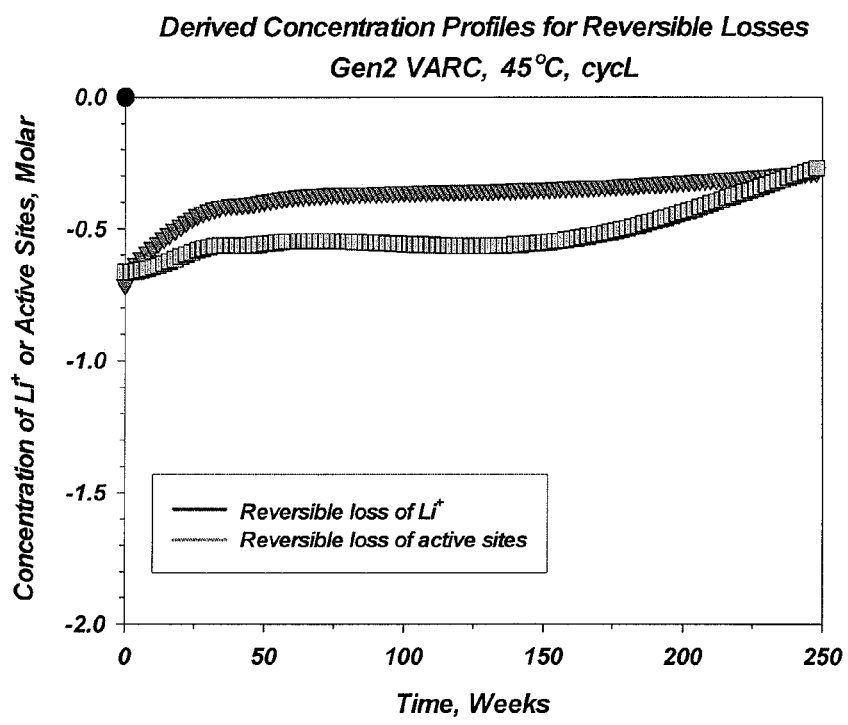
Figure 11C:
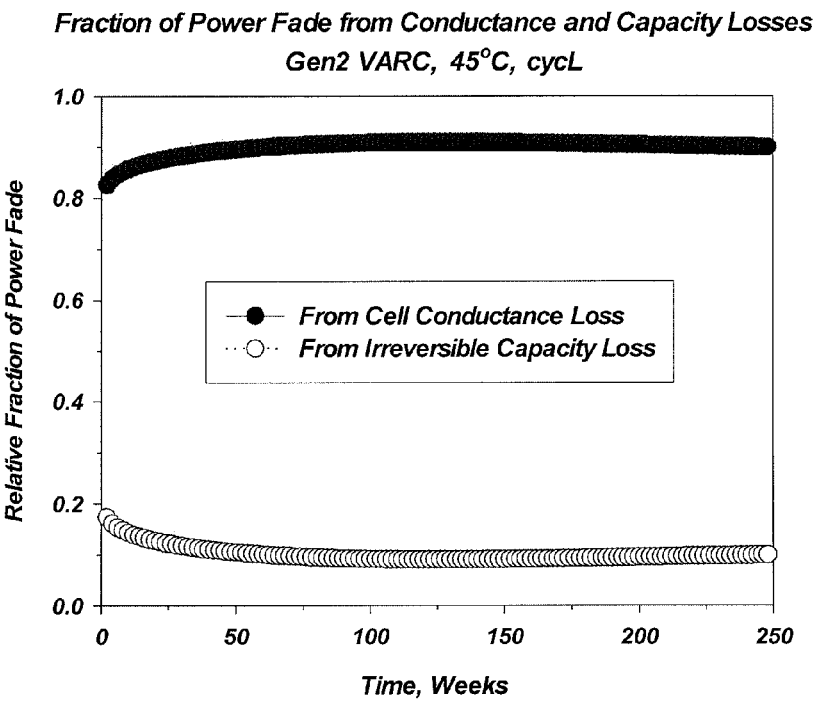

FIGS. 11A-11C illustrate data from analyses of MSM for Gen2 VARC cells cycle-life tested at 45° C. and 60% SOC. FIGS. 11A-11C are similar to FIGS. 7A-7C except that the data is determined at 45° C. and for Gen2 VARC cells in FIGS. 9A-9C rather than the 25° C. and Gen2 cells of FIGS. 7A-7C. Therefore, the description for FIGS. 7A-7C may be applied to FIGS. 9A-9C with the same relative curves apparent without using element designators for each curve.

Figure 12:
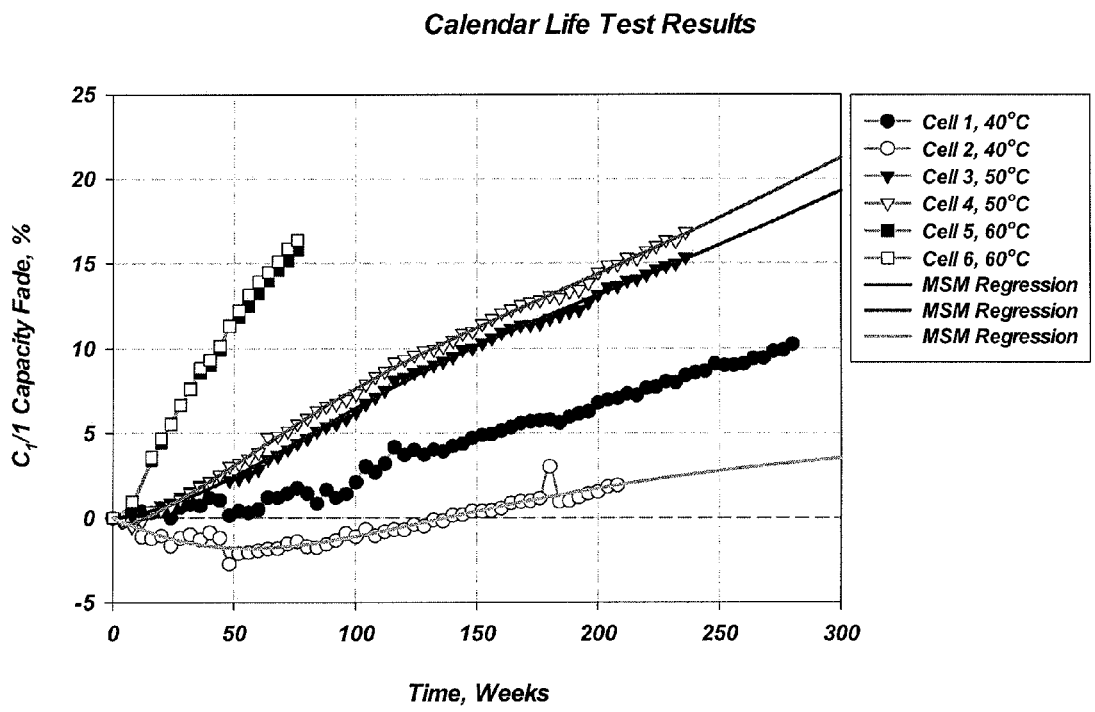
FIG. 12 illustrates capacity fade profiles and three-term MSM regression results for selected high-power cells on test at the INL under calendar-life conditions.

FIG. 12 illustrates capacity fade profiles and three-term MSM regression results for selected commercial high-power cells tested at the INL under calendar-life conditions. Note that MSM results show particularly high fidelity to the data due to the inclusion of θ and Li+ source terms. The data and modeling results indicate that this chemistry exhibits a lithium source over time, which may result in negative capacity loss under some conditions. Such a lithium reserve is not unusual for some cathode types such as nickel-containing metal oxide composites. Thus, a three-term MSM approach was used to provide the results in FIG. 9 using expressions for loss of active host sites, loss of free lithium, and addition of free lithium from a lithium source.

Some comments are in order regarding the plateau type behavior of capacity loss seen for example in FIGS. 5A, 5B, 6D, and 8D. These plateaus arise primarily because the independent MSM contributions are arriving toward their respective upper limits Mj without additional mechanisms or complex interactions between mechanisms. If additional capacity loss mechanisms become manifest much later in cell life, or if mechanisms become inter-dependent or second-order, then the plateaus will increase accordingly within the effects of each unique aging test condition. Test data at greatly prolonged time would be required to establish whether the plateau trends are actually affected by additional mechanisms or nonlinear order of dependence of the θ and Li+ contributions. The MSM formalism can then be adapted to this inter-dependence of mechanisms through expressions of the type $$\Psi_i' = \left(\sum_j (1 + f(\Psi_j, \Psi_k))\right) \sum_j 2M_j \left[\frac{1}{2} - \frac{1}{1 + \exp(a_j t^{b_j})}\right]_i \quad (41)$$

for $j$ contributing mechanisms $(k \neq j)$ or $$\Psi_i' = \sum_j \left\{ 2M_j \left[\frac{1}{2} - \frac{1}{1 + \exp(a_j t^{b_j})}\right]_i (1 + f(\Psi_j, \Psi_k)) \right\} \quad (42)$$

for $j$ contributing mechanisms $(k \neq j)$ wherein the prime notation (') indicates these special cases of inter-dependent or nonlinear order of dependence of the primary contributions. The $f(\overline{\Psi}_j, \overline{\Psi}_k)$ term can be served mathematically by several function types, most notably an exponential function that incorporates baseline thresholds for θ and Li+.

In summary, the collective MSM results demonstrated herein show a unique capability towards tracking, analyzing, and predicting various aspects of capacity loss in Li-ion cells. As such, it is a powerful diagnostic tool that increases our understanding of cell performance, and can support cell development and improvement of Li-ion technology, as well as implementation and monitoring within various applications.

The MSM enables accurate mechanistic interpretations of capacity loss in Li-ion electrochemical systems, providing advantages over purely empirical methods in determining realistic contributions tied to the loss of effective capacity at arbitrary conditions. The disclosed methodology enables diagnostic analysis to be performed, accurately providing quantities central to understanding capacity loss in Li-ion electrochemical devices as a function of time. Some of these quantities are: (1) Fraction of Active, Available Sites (FAAS, θ), (2) Fraction of Available Labile Lithium (FALL, Li+), (3) concentrations of these quantities, (4) reversible and irreversible contributions to these quantities, (5) rate expressions for these quantities, and (6) baseline values determined at beginning of life (BOL).

This capability may be developed for different arbitrary cycling rates, given a low-rate baseline such as C1/25. The MSM formalism not only accounts for terms covering capacity loss, but also, capacity gain (from a source), and capacity offset in relation to a baseline condition.

The analytical form of the MSM enables closed form solution to its derivative with respect to time, yielding analytical rate expressions for key quantities relating to cell capacity loss and its components. The generalized form of the MSM enables the determination of a variable number of primary mechanisms related to capacity loss.

The generalized form of the MSM makes it amenable to analyzing any Li-ion dataset of capacity-over-time obtained at an arbitrary set of test conditions and enables predictive assessments of capacity fade once the parameters have been sufficiently trained with mature data trends.

The method provides for incorporating a design-rated or theoretical baseline capacity at BOL to determine the unrecoverable capacity loss at BOL at any cycling rate. The method also provides for the estimation of the relative fraction of power fade attributable to capacity loss and conductance loss.

The method is robust and accurate over temperature variations. The formalism applies equally to charge and discharge conditions. The collective capability of MSMs can be integrated into a scheme for Li-ion materials screening and technology improvement to minimize or mitigate the rate of loss of θ and Li+, and thus improve longevity of Li-ion cells.

Applications for this capability abound in battery research and product development, as well as onboard monitoring of consumer electronics, battery power grid applications, and vehicle applications (e.g., electric vehicles (EV), hybrid electric vehicles (HEV), and plug-in hybrid electric vehicles (PHEV)).

Finally, the disclosed methodology is not limited to the lithium-ion application. The MSM formalism can be adapted to other battery applications and other systems wherein one or more time-dependent degradation mechanisms are operative.

Although this invention has been described with reference to particular embodiments, the invention is not limited to these described embodiments. Rather, the invention is encompassed by the appended claims and their legal equivalents.

What is claimed is:

1. A method of analyzing capacity loss of an electrochemical cell, comprising:
    modeling a loss of active host sites of the electrochemical cell with a first sigmoid expression;
    modeling a loss of free lithium of the electrochemical cell with a second sigmoid expression;
    combining the first sigmoid expression and the second sigmoid expression to develop a multiple sigmoid model; and
    estimating a capacity loss of the electrochemical cell at a desired point in time using the multiple sigmoid model;
    wherein a processor performs at least one of the acts of the method of analyzing capacity loss of the electrochemical cell.

2. The method of claim 1, further comprising estimating reversible loss elements for one or more of the loss of active host sites and the loss of free lithium and augmenting the multiple sigmoid model with the reversible loss elements.

3. The method of claim 1, further comprising estimating irreversible loss elements for one or more of the loss of active host sites and the loss of free lithium and augmenting the multiple sigmoid model with the irreversible loss elements.

4. The method of claim 1, further comprising defining a baseline capacity for the electrochemical cell at a substantially low cycling rate.

5. The method of claim 4, wherein the low cycling rate is substantially C/25.

6. The method of claim 1, further comprising defining an offset for the multiple sigmoid model at a beginning-of-life condition using a relatively low cycling rate to model polarization effects at higher cycling rates.

7. The method of claim 1, further comprising predicting a maximum capacity fade from a plateau of the multiple sigmoid model as the electrochemical cell approaches and end-of-life condition.

8. The method of claim 1, further comprising interpolating, extrapolating, or a combination thereof, to estimate capacity loss at various cycle rates.

9. The method of claim 1, further comprising: modeling an addition of free lithium from a lithium source or a lithium reserve of the electrochemical cell with a third sigmoid expression; and including the third sigmoid expression in the multiple sigmoid model.

10. The method of claim 1, further comprising:
    estimating conductance loss for the electrochemical cell;
    determining a fraction of power loss due to conductance loss relative to a power goal; and
    determining a fraction of power loss due to capacity fade as a portion of overall power loss not related to the fraction of power loss due to conductance loss.

11. The method of claim 1, wherein each of the loss of active host sites and the loss of free lithium are derived from chemical kinetics reaction rates.

12. The method of claim 1, wherein the loss of active host sites and the loss of free lithium are determined from cell characteristics sampled from the electrochemical cell.

13. A model development method, comprising:
    periodically sampling cell characteristics of an electrochemical cell;
    determining a loss of active host sites and a loss of free lithium from the cell characteristics;
    periodically adding the loss of active host sites to a first sigmoid expression;
    periodically adding the loss of free lithium to a second sigmoid expression; and
    combining the first sigmoid expression and the second sigmoid expression to develop or augment a multiple sigmoid model of the electrochemical cell;
    wherein a processor performs at least one of the acts of the model development method.

14. The model development method of claim 13, further comprising selecting the cell characteristics to include one or more of a cycling rate, a voltage, a current, and a temperature.

15. The model development method of claim 13, further comprising estimating a capacity loss of the electrochemical cell at a desired point in time using the multiple sigmoid model.

16. The model development method of claim 13, further comprising estimating reversible loss elements for one or more of the loss of active host sites and the loss of free lithium and augmenting the multiple sigmoid model with the reversible loss elements.

17. The model development method of claim 13, further comprising estimating irreversible loss elements for one or more of the loss of active host sites and the loss of free lithium and augmenting the multiple sigmoid model with the irreversible loss elements.

18. A method of adapting to analysis of capacity loss of an electrochemical cell, comprising:
    modeling a loss of active host sites of the electrochemical cell with a first sigmoid expression;
    modeling a loss of free lithium of the electrochemical cell with a second sigmoid expression;

combining the first sigmoid expression and the second sigmoid expression to develop a multiple sigmoid model;

estimating a capacity loss of the electrochemical cell at a desired point in time using the multiple sigmoid model; and modifying at least one of a discharge process for, a charge process for, and composition of, the electrochemical cell responsive to the estimating the capacity loss;

wherein a processor performs at least one of the acts of the method of adapting to analysis of capacity loss of the electrochemical cell.

19. The method claim 18, wherein modifying the composition of the electrochemical cell comprises at least one of modifying a composition of an anode, modifying a composition of a cathode, modifying a composition of an electrolyte, and modifying a relative arrangement of the anode, the cathode, and the electrolyte.

20. A system, comprising:
at least one electrochemical cell;
monitoring hardware operably coupled to the at least one electrochemical cell and configured for periodically sampling cell characteristics of the at least one electrochemical cell;
a computing system operably coupled to the monitoring hardware and configured for periodically determining electrochemical cell information from to the cell characteristics of the electrochemical cell;
adding a loss of active host sites from the electrochemical cell information to a first sigmoid expression;
adding a loss of free lithium from the electrochemical cell information to a second sigmoid expression; and
combining the first sigmoid expression and the second sigmoid expression to develop or augment a multiple sigmoid model of the at least one electrochemical cell.

21. The system of claim 20, wherein the computing system comprises a memory for storing computing instructions and a processor operably coupled to the memory and configured for executing the computing instructions to carry out the acts of determining the electrochemical cell information, adding the loss of active host sites, adding the loss of free lithium, and combining the first sigmoid expression and the second sigmoid expression.

22. The system of claim 20, wherein the computing system is further configured for estimating a capacity loss of the electrochemical cell at a desired point in time using the multiple sigmoid model.

23. A non-transitory computer-readable medium including computer-executable instructions, which when executed on one or more processors, perform the acts comprising:
periodically sampling cell characteristics of an electrochemical cell;
determining a loss of active host sites and a loss of free lithium from the cell characteristics;
periodically adding the loss of active host sites to a first sigmoid expression;
periodically adding the loss of free lithium to a second sigmoid expression; and
combining the first sigmoid expression and the second sigmoid expression to develop or augment a multiple sigmoid model of the electrochemical cell.

24. The non-transitory computer-readable medium of claim 23, wherein the cell characteristics include one or more of a cycling rate, a voltage, a current, and a temperature.

* * * * *